United States Patent
Otose et al.

(10) Patent No.: US 7,889,832 B2
(45) Date of Patent: Feb. 15, 2011

(54) BOOTSTRAP CIRCUIT, SHIFT REGISTER EMPLOYING THE SAME AND DISPLAY DEVICE

(75) Inventors: Tomohiko Otose, Kanagawa (JP); Masamichi Shimoda, Kanagawa (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 12/470,788

(22) Filed: May 22, 2009

(65) Prior Publication Data
US 2009/0290677 A1 Nov. 26, 2009

(30) Foreign Application Priority Data
May 26, 2008 (JP) ............................. 2008-136531
May 13, 2009 (JP) ............................. 2009-116831

(51) Int. Cl.
*G11C 19/00* (2006.01)
(52) U.S. Cl. .......................................... 377/67; 377/64
(58) Field of Classification Search ...................... None
See application file for complete search history.

(56) References Cited

U.S. PATENT DOCUMENTS

| | | | |
|---|---|---|---|
| 5,222,082 A * | 6/1993 | Plus ............................. | 377/79 |
| 6,876,353 B2 | 4/2005 | Morosawa et al. | |
| 6,928,135 B2 * | 8/2005 | Sasaki et al. .................. | 377/64 |
| 2005/0185752 A1 * | 8/2005 | Sasaki et al. .................. | 377/64 |
| 2007/0274433 A1 * | 11/2007 | Tobita .......................... | 377/64 |

FOREIGN PATENT DOCUMENTS

| | | | |
|---|---|---|---|
| JP | 2003-016794 A | 1/2003 | |
| JP | 2003-346492 A | 12/2003 | |

* cited by examiner

*Primary Examiner*—Cassandra Cox
(74) *Attorney, Agent, or Firm*—Sughrue Mion, PLLC

(57) ABSTRACT

Disclosed is a shift register which includes first transistor connected between a first clock signal terminal and an output terminal, a second transistor with a gate connected to an input terminal and a source connected to a gate of the first transistor, a third transistor with a gate connected to a second clock signal terminal, an inverter with an input connected to the input terminal, a fourth transistor cascode connected to the third transistor with a gate connected to an output of the inverter, a fifth transistor connected between the gate of the first transistor and a power supply terminal, a sixth transistor connected between the fourth transistor and the power supply terminal with a gate connected to the input terminal, and a seventh transistor connected between the output terminal and the power supply terminal, the fifth and seventh transistors having gates connected in common to a connection node of the fourth and the sixth transistors.

19 Claims, 25 Drawing Sheets

BOOTSTRAP CIRCUIT, SHIFT REGISTER EMPLOYING THE SAME AND DISPLAY DEVICE

REFERENCE TO RELATED APPLICATION

This application is based upon and claims the benefit of the priority of Japanese patent applications No. 2008-136531 filed on May 26, 2008 and No. 2009-116831 filed on May 13, 2009, the disclosures of which are incorporated herein in their entirety by reference thereto.

TECHNICAL FIELD

This invention relates to a technique for driving a display device. More particularly, it relates to a bootstrap circuit that may be used with advantage in a driving circuit for a display device, such as a liquid crystal display device or an organic EL (electroluminescence) display device, and to a shift register that uses the bootstrap circuit.

BACKGROUND

Recently, an active matrix display, in which a thin film transistor as an active element is integrated in each pixel, has come into widespread use. For example, in a mobile device, such as mobile phone, an active matrix liquid crystal display device, employing a polysilicon transistor, has come to be used widely because the display device may be of a reduced size.

Polysilicon thin film transistors are higher in mobility than amorphous silicon thin film transistors. Hence, a driving circuit, for example, may be fabricated by the same process as that for producing a pixel transistor that forms a pixel.

The driving circuit used in a display device includes a gate line driving circuit which drives a plurality of scanning lines (gate lines) and a source line driving circuit which drives a plurality of signal lines (source lines). The gate lines and the signal lines intersect each other. Each of the driving circuits includes a scanning circuit including a plurality of shift register stages.

In a shift register stage making up the scanning circuit, a CMOS (Complementary MOS) circuit, which is a combination of an n-channel transistor and a p-channel transistor, is generally used. However, in the CMOS manufacturing process, since both of a n-channel transistor and a p-channel transistor are to be manufactured, not only the number of process steps but also the manufacturing cost is increased.

To avoid these difficulties, such a driving circuit, composed only of p-channel transistors or n-channel transistors, that is, transistors of single conductivity types, has also been proposed.

The driving circuit, composed only of transistors of a single conductivity type, includes a shift register which makes use of a two-phase to four-phase clock signal. Each shift register stage is formed by a circuit exploiting a bootstrap effect.

As a related art of a shift register stage, making use of two-phase clocks, reference may be made to Patent Document 1 (JP Patent Kokai Publication No. JP-P2003-016794A). This shift register circuit includes n-number shift register stages RS(1) to RS(n), as shown herein in FIG. 16 (FIG. 4 of Patent Document 1). The shift register stage RS(k) includes an input signal terminal IN, an output signal terminal OUT, a reference voltage terminal SS, a constant voltage terminal DD, a clock signal input terminal clk (clk1 or clk2) and a reset signal input terminal RST. To the input signal terminal IN of the shift register stage RS(1) is supplied a start signal Vst from a controller. The input signal terminal IN of the stage RS(k) (k=2 to n) is connected to the output signal terminal OUT of the preceding stage RS(k–1). The reset signal input terminal RST of the stage RS(k) other than the last stage RS(n) is connected to the output signal terminal OUT of the succeeding stage RS(k+1). A reset signal Vrst from the controller is supplied to the reset signal input terminal RST of the last stage RS(n). A clock signal CK1 from the controller is supplied to the clock signal terminal clk1 of the odd stage RS(k), while a clock signal CK2 from the controller is supplied to the clock signal terminal clk2 of the even stage RS(k). The clocks CK1 and CK2 are alternately set to HIGH, every time slot, for a preset interval of each time slot during which an output signal of each shift register stage is shifted from one stage to the next. When a two-phase clock signal is used, an output of a succeeding stage shift register is used as a reset signal. Since there is no succeeding stage for the last stage, it is necessary to apply a devoted reset signal from outside for the last stage.

FIG. 17 (FIG. 10 of Patent Document 1) shows a configuration of a shift register stage disclosed in Patent Document 1. When an input signal is HIGH, transistors 21 and 34 are turned on, while the transistor 22 is turned off to raise the potential at a node A. If the input signal then goes LOW, the potential at the node A is maintained. If the clock signal clk1 goes HIGH, the potential at the node A is further raised, owing to a bootstrap effect, and hence a HIGH output signal OUT is output from the stage. When a reset signal RST is HIGH, the transistor 33 is turned on to set a node F to HIGH. The transistor 22 then is turned on to lower the potential at the node A. The on-state of transistor 22 is maintained until the input signal subsequently goes HIGH.

As a related art employing a three-phase clock signal, reference is made to Patent Document 2 (JP Patent Kokai Publication No. JP-P2003-346492A), for example. If a three-phase clock signal is used, the reset signal for the last stage, needed for the two-phase clock, no longer needs to be used. The same applies for a four-phase clock signal as well.

[Patent Document 1] JP Patent Kokai Publication No. JP-P2003-016794A (see e.g., FIGS. 4, 10 and 11)
[Patent Document 2] JP Patent Kokai Publication No. JP-P2003-346492A (see e.g., FIG. 4)

SUMMARY

The entire disclosures of Patent Documents 1 and 2 are incorporated herein by reference thereto.

The following is an analysis of the related art by the present invention.

In a two-phase clock shift register, disclosed in e.g. Patent Document 1, an output signal of the succeeding stage is used for resetting. This resetting is carried out in a frame period. Thus, should a leakage current of a transistor which constitutes a shift register circuit, be of a large value, the electric charge, once stored, is varied, thus leading to circuit malfunctions.

This point will now be discussed with reference to FIGS. 17 and 18. A timing chart for illustrating the circuit operation of FIG. 17 is shown in FIG. 18 (FIG. 11 of Patent Document 1).

The resetting operation occurs from time point t2, when RST is set to HIGH, until t3. During the time interval, the transistor 33 becomes conductive, that is, set to an on-state, to set the node F to HIGH.

From time point t3 on, RST is LOW, so that the transistor 33 becomes non-conductive (that is, is turned off). However, the node F is kept at a high level voltage, that is, holds electric charge. The leakage current of the transistor increases with rise in temperature or by light illumination, for example. In case of large value of the leakage current of transistors 33 and 34, the voltage retained by the node F is decreased. If the voltage at the node F is decreased, the transistor 22, which should stay conductive until next resetting, is rendered non-conductive, with the node A then being in a floating state.

If the node A is in the floating state, the node A is fluctuated, by the clock signal clk, coupled to the drain terminal of the transistor 24, via a drain-to-gate capacitance of the transistor 24, as a result of which the transistor 24 is turned on to deliver the clock signal clk at an output OUT to cause a circuit malfunction.

The three-phase clock shift register suffers a problem that the number of clocks is larger than that with the two-phase clock shift register, thus complicating the circuit and increasing the production cost. The same applies for the four-phase clock shift register that uses a larger number of clocks.

It is therefore an object of the present invention to provide a circuit which does not malfunction even in case of a large leakage current value of the transistor, and a display device having the circuit.

The invention disclosed in the present application is substantially of the following configuration. It should be noted that, although reference numerals are used in the following description to depict component parts, these reference numerals are for assisting in the understanding only and should not be construed as restricting the present invention.

The present invention provides a bootstrap circuit that generates an output signal (OUT) from an input signal (IN) and a plurality of clock signals (CL1, CL2). The bootstrap circuit includes a first transistor (Tr1) that outputs a voltage of a first clock signal (CL1) out of the plurality of clock signals, as an output signal (OUT), a first control means that is connected to a control electrode (node N1) of the first transistor (Tr1) and that renders the first transistor (Tr1) conductive, that is, turns it on, in response to a value of the input signal (IN), and a second control means that is connected to the control electrode (node N1) of the first transistor (Tr1) and that renders the first transistor (Tr1) non-conductive, that is, turns it off. In case the clock signals are two-phase clocks, the second control means uses a second clock signal (CL1) having the phase shifted by one-half period from the first clock signal.

In the present invention, the first control means renders the first transistor (Tr1) conductive, that is, turns it on, in response to a value of an input signal (IN). The first control means then outputs an output signal (OUT) by the bootstrap effect of the first transistor (Tr1). The first control means then renders the first transistor (Tr1) non-conductive, that is, turns it off, by the second control signal (CL2) having a phase shift of one period with respect to the first clock signal (CL1) to generate an output signal (OUT) having a phase shift with respect to the input signal (IN). A voltage that renders the first transistor (Tr1) non-conductive is applied to the control electrode of the first control means (node N1) with the clock period of the second clock signal (CL2).

In the present invention, the first control means may include a second transistor (Tr2) that is rendered conductive in response to the value of the input signal (IN).

In the present invention, the second control means includes a third transistor (Tr3) that is rendered conductive by the second control signal (CL2), a fourth transistor (Tr4) connected in series with the third transistor (Tr3), an inverter (100) that controls the conducting/non-conducting state of the fourth transistor (Tr4) depending on the value of the input signal (IN), a fifth transistor (Tr5) which, when rendered conductive by the third transistor (Tr3) and the fourth transistor (Tr4), renders the first transistor (Tr1) non-conductive, and a sixth transistor (Tr6) that renders the fifth transistor (Tr5) non-conductive in response to the value of the input signal (IN).

In the second control means, when the input signal (IN) is entered, that is, takes on a first value, the fourth transistor (Tr4), the control electrode of which receives an output of the inverter (100) receiving the input signal (IN) is rendered non-conductive, and the sixth transistor (Tr6) and the second transistor (Tr2) are conductive. As a result, the fifth transistor (Tr5) is rendered non-conductive and a voltage that renders the first transistor (Tr1) non-conductive is not output, that is, the first transistor (Tr1) is rendered conductive.

In the present invention, when the input signal (IN) is not entered, that is, takes on a second value, the fourth transistor (Tr4) that receives an output of the inverter circuit (100) at its control electrode is rendered conductive and the sixth transistor (Tr6) and the second transistor (Tr2) are rendered non-conductive. When the third transistor (Tr3) is conductive, the fifth transistor (Tr5) is rendered conductive. The voltage at the control electrode (node N1) of the first transistor (Tr1) is thus set to a value that renders the first transistor (Tr1) non-conductive. With this configuration, there is no such a case that a voltage that renders the first transistor (Tr1) conductive and a voltage that renders the first transistor (Tr1) non-conductive are output simultaneously.

In the present invention, the fifth transistor (Tr5) is rendered non-conductive by the input signal (IN) being supplied to the sixth transistor (Tr6). There is provided a seventh transistor (Tr7) that is rendered conductive when the fifth transistor (Tr5) is conductive to output a power supply voltage (VDD) as the output signal (OUT). The power supply voltage (VDD) is thus output as output signal (OUT) when the first transistor (Tr1) is in a non-conducting state.

In the present invention, there may be provided a third control means that is connected to a control terminal of the seventh transistor (Tr7) and has a function for rendering the first transistor (Tr1) non-conductive, responsive to a control signal (RST).

In the present invention, the third control means may include an eleventh transistor (Tr11) that is controlled to be conductive/non-conductive by the control signal.

In the present invention, the inverter circuit may be adapted to cut off a current path between a high potential power supply and a low potential power sully, when rendering the fourth transistor (Tr4).

According to the present invention, the first control means includes a second transistor (Tr2) and a tenth transistor (Tr10) connected in series with the second transistor (Tr2) and that has its conducting state controlled by the second clock signal (CL2)

In the present invention, an output signal obtained by phase shifting the input signal sequentially is produced by the sift register composed by a plurality of stages of bootstrap circuits cascade connected. The first and third transistors (Tr1, Tr3) of the bootstrap circuit of an odd stage such as a first, third, fifth stage and so on are supplied with the first and second clock signals (CL1, CL2), respectively, and the first and third transistors (Tr1, Tr3) of the bootstrap circuit of an even stage such as a second, fourth, sixth stage and so on are supplied with the second and first clock signals (CL2, CL1).

Alternatively, in the present invention, the plurality of clock signals may include three-phase clock signals and in a shift register stage in which the remainder obtained on dividing the stage number by three is 1, a first phase clock and a third phase clock are respectively received as the first and second clock signals. In a shift register stage in which the remainder obtained on dividing the stage number by three is 2, the first phase clock and a second phase clock are respectively received as the first and second clock signals. In a shift register stage in which the remainder obtained on dividing the stage number by three is 0, the third phase clock and the second phase clock are respectively received as the first and second clock signals.

In the present invention, an output signal and a voltage of a control terminal of the first transistor of a preceding stage may be delivered respectively to an input terminal and a control terminal of the second transistor of a succeeding stage, and in an initial stage, a start pulse signal may be supplied in common to the input terminal and to the control terminal of the second transistor.

In another aspect of the present invention, there is provided a display device or an electronic device having a driving circuit formed by the shift register according to the present invention.

According to the present invention, circuit malfunctioning may be prohibited even in case of large amounts of leakage current.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
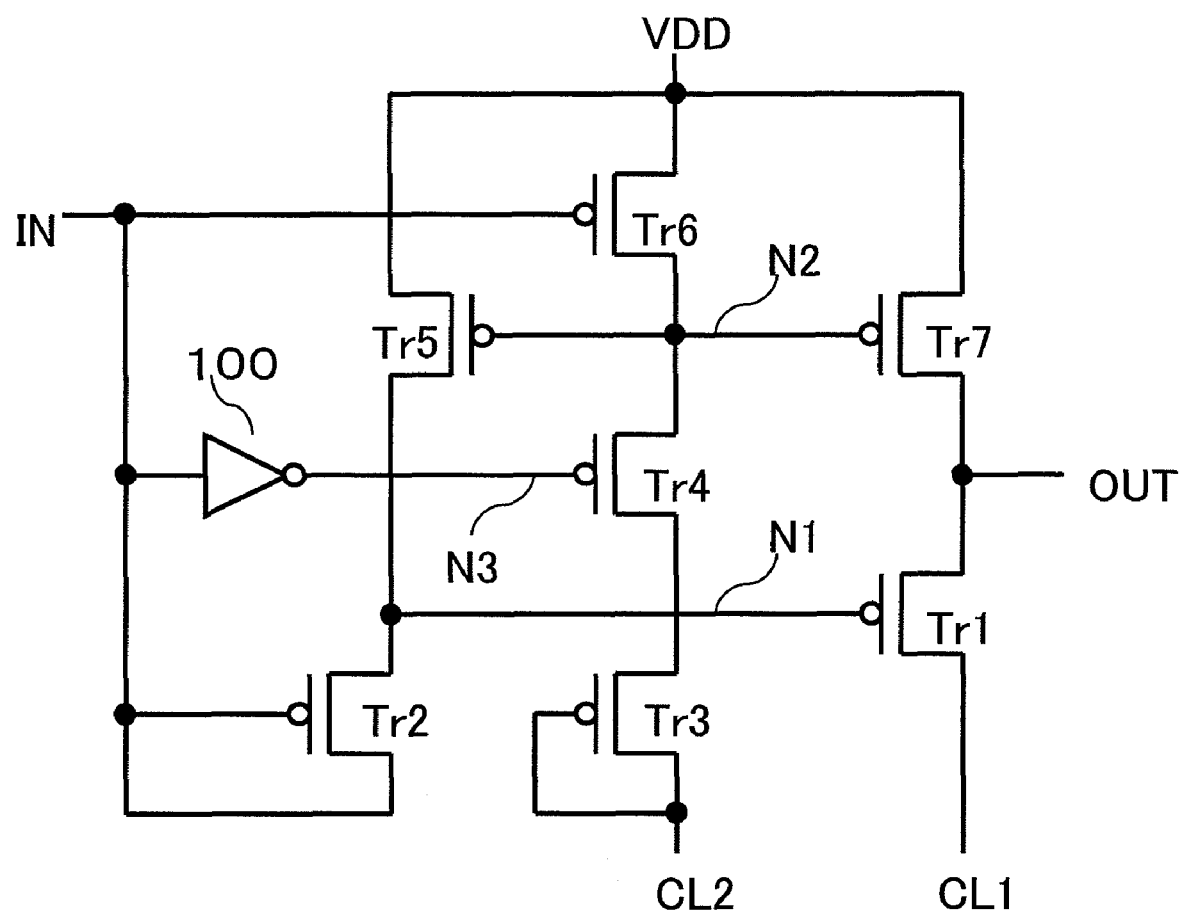
FIG. 1 is a circuit diagram for illustrating a bootstrap circuit of a first exemplary embodiment 1 of the present invention.

Preferred modes of the present invention will now be described. In one aspect of the present invention, there are provided two transistors (Tr7, Tr1) connected in series between a power supply terminal (VDD) and a first clock signal terminal (CL1). A connection node of the transistors (Tr7, Tr1) is connected to an output terminal (OUT). There are also provided three transistors (Tr6, Tr4, Tr3) connected in series between the power supply terminal (VDD) and the second clock signal terminal (CL2). There are further provided a transistor (Tr5) connected between the power supply terminal (VDD) and the gate of the transistor (Tr1) and a transistor (Tr2) connected in series with the transistor (Tr5). The gates of the transistors (Tr2, Tr6) are connected to the input terminal (IN). The gate of the transistor (Tr4) is connected to an output of the inverter (100) which has an input connected to the input terminal (IN). The gates of the transistors (Tr5, Tr7) are connected in common to a connection node of the transistors (Tr6, Tr4). The gate of the transistor (Tr1) is connected to a connection node of the transistors (Tr5, Tr2).

In the present invention, the voltage that renders the transistor (Tr1) non-conductive is applied to the gate of the transistor (Tr1) with a short clock cycle, thus prohibiting circuit malfunctioning even in case of larger magnitudes of the leakage current. In addition, since the second clock signal (CL2) having a phase lead of one-half cycle with respect to the first clock signal (CL1), renders the transistor (Tr1) non-conductive, the transistor (Tr1) may be kept in its non-conducting state until shortly before the delivery of the first clock signal (CL2). Hence, the normal operation of the shift register circuit may be guaranteed even in case of larger magnitude of the leakage current. This advantageous effect of the present invention may be obtained not only with a circuit employing two-phase clocks but also with a circuit employing clocks with three or more phases.

According to the present invention, malfunctions ascribable to leakage current may be prohibited from occurring. In case the present invention is applied to a driving circuit of the display device, it is possible to improve the operational reliability of the display device. The present invention will now be described with reference to preferred exemplary embodiments.

In the following description, a threshold voltage of a p-channel transistor is denoted as −Vt, a threshold voltage of an n-channel transistor is denoted as Vt. Vt, with a sign thereof being omitted, is termed a threshold value or a threshold value voltage. A high voltage side of a clock signal and an input signal is termed a HIGH level, while a low voltage side thereof is termed a LOW level. The high voltage side and the low voltage side of a power supply are VDD and VSS, respectively. If the voltages of the HIGH level and the LOW level of a signal are the same as VDD and VSS, respectively, the VDD voltage and the VSS voltage are termed a HIGH level and a LOW level, respectively.

FIG. 1 is a circuit diagram showing a bootstrap circuit of an exemplary embodiment of the present invention. Referring to FIG. 1, the bootstrap circuit of the present exemplary embodiment includes first to seventh p-channel transistors Tr1 to Tr7 and an inverter circuit 100. The p-channel transistor Tr1 is connected between a first clock signal terminal CL1 and the output terminal OUT. The transistor Tr2 has a control terminal (gate electrode) connected to the input terminal IN, while having a source connected to a control terminal (gate electrode) of the transistor Tr1, that is, to a node N1. The transistor Tr3 has a control terminal (gate electrode) connected to a second clock signal terminal CL2. The inverter 100 has an input connected to the input terminal IN. The transistor Tr4 is cascode connected to the transistor Tr5, and has its control terminal (gate electrode) connected to an output of the inverter circuit 100 (node N3). The transistor Tr5 is connected between the control terminal (gate terminal) of the transistor Tr1 (node N1) and the power supply terminal VDD. The transistor Tr6 is connected between the transistor Tr4 and the power supply terminal VDD and has a control terminal (gate electrode) connected to the input terminal IN. The transistor Tr7 is connected between the output terminal OUT and the power supply terminal VDD. The control terminals (gate terminals) of the transistors Tr5 and Tr7 are connected in common to a connection node of the transistors Tr4 and Tr6, that is, to a node N2. In the exemplary embodiment of FIG. 1, the transistors Tr2 and Tr3 each are diode-connected, though not imposing limitation on the present invention.

The operation of the circuit of FIG. 1 will now be described. The transistor Tr2 receives a signal at the input terminal IN (termed as an input signal IN), at its gate and drain electrodes. When the input signal IN is LOW, the transistor Tr2 is turned on and becomes conductive. At this time, the source of the transistor Tr2 (node N1) is at a voltage higher than the LOW level (VSS) of the input signal IN by a threshold value Vt of the transistor Tr2 (VSS+Vt).

When the voltage at the node N1 is VSS+Vt, the transistor Tr1 becomes conductive. Although the input signal IN is connected to the drain and gate electrodes of the transistor Tr2, the input signal IN is connected to the gate electrode of the transistor Tr2 and the drain terminal of the transistor Tr2 may be connected to the power supply terminal VSS.

The inverter circuit 100 outputs an inverted version of the input signal IN to the gate electrode of the transistor Tr4.

The transistor Tr6 becomes conductive when the input signal IN is at LOW level. The drain terminal (Node N2) of the transistor Tr6 then goes HIGH (VDD).

The transistors Tr7 and Tr1 drive a load (not shown) connected to an output terminal (OUT). It is observed that the transistors Tr7 and Tr1 have current driving capabilities set to higher values by having their channel widths set so as to be larger by e.g. one order of magnitude than those of the other transistors Tr2 to Tr6.

When the voltage of the node N2 is low (VSS+2Vt), the transistor Tr5 becomes conductive to set the node N1 to a HIGH level (VDD).

When the output voltage of the inverter circuit 100 is at low level, the transistor Tr4 is rendered conductive to transfer the LOW level of the second clock signal CL2 to the node N2 via the transistor Tr3.

The transistor Tr3 is rendered conductive when the clock signal CL2 is LOW. When the transistor Tr4 is conductive, the node N2 is at a voltage higher by two threshold values than the LOW level (VSS+2Vt).

When the potential of the node N2 is VSS+2Vt, the transistor Tr5 is rendered conductive. The node N1 then goes HIGH (VDD) to turn off the transistor Tr1.

In the example shown in FIG. 1, the transistor Tr3 is diode-connected, and the second clock signal CL2 is connected to its drain terminal and to its gate electrode. The drain terminal of the transistor Tr3 may be connected to the power supply terminal VSS, and the second clock signal CL2 may be connected to the gate electrode of the transistor Tr3.

The LOW level of a signal may be made to differ from the power supply voltage VSS (low power supply voltage), insofar as this does not affect the operation. The HIGH level of the signal may also be made to differ from the power supply voltage (high power supply voltage) VDD.

In case n-channel transistors are used in the configuration of FIG. 1, it is possible to construct a similar circuit. However, an output differs in this case in polarity.

Figure 2:
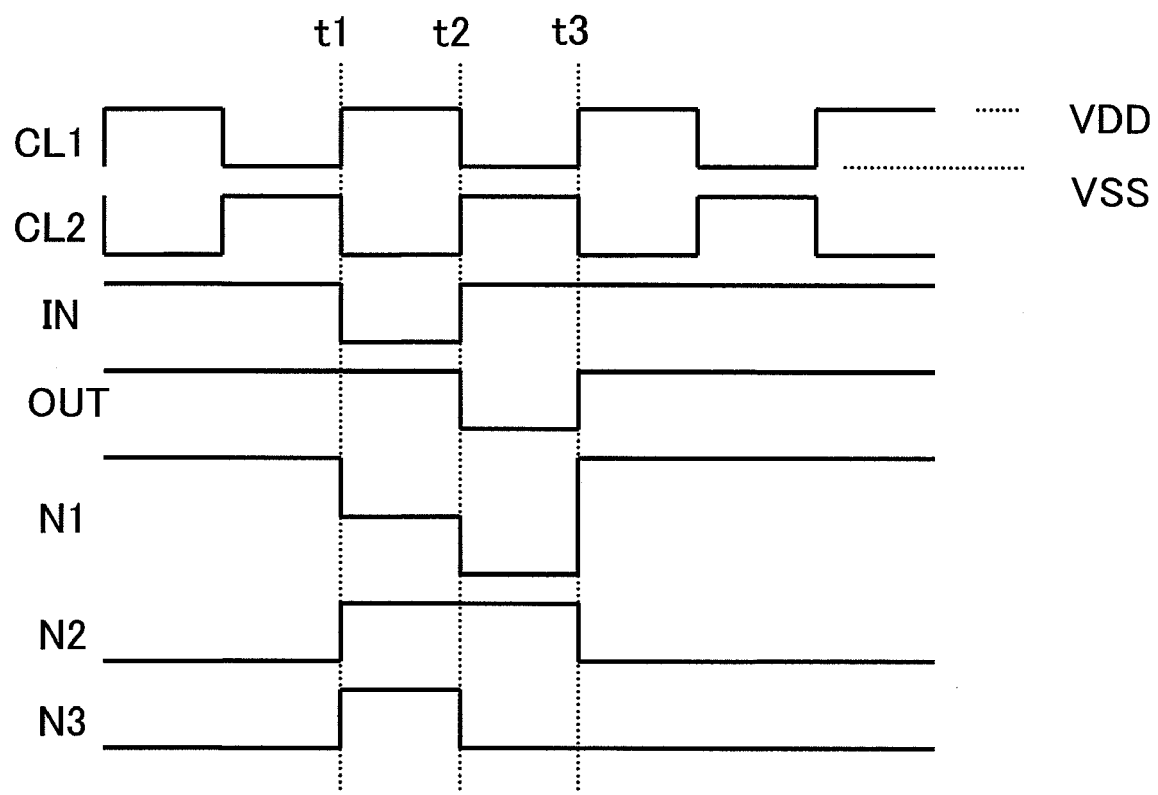
FIG. 2 is a timing chart for illustrating the operation of the bootstrap circuit of FIG. 1.

The operation of the bootstrap circuit of the present embodiment will now be described. FIG. 2 is a timing chart for illustrating the timing operation of the bootstrap circuit of FIG. 1. There are shown waveforms of the first and second clock signals CL1 and CL2, the input signal IN, the output signal OUT and the voltages of the nodes N1 to N3. The HIGH level of each of the first and second clock signals CL1 and CL2 and the input signal IN is VDD, while the LOW level thereof is VSS. The first and second clock signals CL1 and CL2 are complementary, that is, having phases reversed to each other.

If, in FIG. 2, the input signal IN is changed from the HIGH level to the LOW level at time t1, the transistor Tr2 is rendered conductive. Hence, the voltage at the node N1 changes to a value higher than the LOW level of the input signal IN by the threshold value (VSS+Vt). Since the transistor Tr6 is also rendered conductive, the voltage at the node N2 changes to a HIGH level. When the voltage at the node N2 is HIGH, the transistors Tr5 and Tr7 are rendered non-conductive. The output N3 of the inverter 100 outputs a HIGH level, which is obtained by inverting the LOW level of the input signal IN, and hence the transistor Tr4 is rendered non-conductive. With the transistor Tr4 non-conductive, the LOW level of the clock signal CL2 is not supplied via the transistor Tr3 to the node N2.

At this time, the transistor Tr1 is rendered conductive. However, since the first clock signal CL1 is HIGH, the output signal OUT is kept HIGH.

At time t2, the second clock signal CL2 transitions to HIGH level, while the first clock signal CL1 transitions to LOW level. Since there are a capacitance between the gate and drain electrodes and a capacitance between the gate and source electrodes of the transistor Tr1, the voltage at the node N1 is pulled down from VSS+Vt to a further lower voltage, by the bootstrap effect by the respective capacitances. That is, the voltage at the node N1 is now at a value lower than the LOW level.

As a result, a voltage higher than the threshold voltage Vt of the transistor Tr1 is applied across the gate and the source of the transistor Tr1. Hence, the transistor Tr1 continues to be conductive so that the LOW level of the first clock signal CL1 is transferred to the output terminal OUT.

At this time, since the input signal IN has transitioned to the HIGH level, the output node N3 of the inverter circuit 100 is thus LOW, and hence the transistor Tr4 is conductive. At this time, the second clock signal CL2 is HIGH, and hence the transistor Tr3 is non-conductive, so that the HIGH level of the second clock signal CL2 is not transferred to the node N2.

At time point t3, the second clock signal CL2 transitions to the LOW level, while the first clock signal CL1 transitions to the HIGH level. The transistor Tr3 then is rendered conductive. Since the transistor Tr4 also is conductive, the voltage at the node N2, which has so far been HIGH, changes to a voltage higher than the LOW level (VSS) by two threshold values (VSS+2Vt).

As a result, the transistors Tr5 and Tr7 are rendered conductive. With the transistor Tr5 now conductive, the voltage at the node N1, which is lower than the LOW level due to the bootstrap effect, changes to the HIGH level, as a result of which the transistor Tr1, which has been conductive, is rendered non-conductive. On the other hand, since the transistor Tr7 is conductive, the output terminal OUT changes to HIGH level.

From time point t3 on, the LOW level of the second clock signal CL2 continues to be applied to the transistor Tr3 at a constant period. Since the output N3 of the inverter circuit 100 is LOW, and the transistor Tr4 is rendered conductive, the voltage VSS+2Vt continues to be applied to the node N2 from time point t3.

As a result, the transistors Tr5 and Tr7 continue to be conductive, and hence the output signal OUT is kept HIGH. Since the node N1 is also kept HIGH, the transistor Tr1 also continues to be non-conductive. This condition is maintained unchanged until the next input signal IN is entered, that is, until the input signal IN next becomes LOW. Moreover, since the voltage VSS+2Vt continues to be applied to the node N2 at a short period of the clock signal, the circuit does not malfunction, even in case of a large leakage current.

The output OUT, phase-shifted by one half clock period from the input signal IN, may be obtained, as described above. A plurality of the bootstrap circuits, each of which is shown in FIG. 1, may be connected in cascade to construct a shift register in which the signal phase is shifted sequentially.

<Example of a Display Device>

Figure 3:
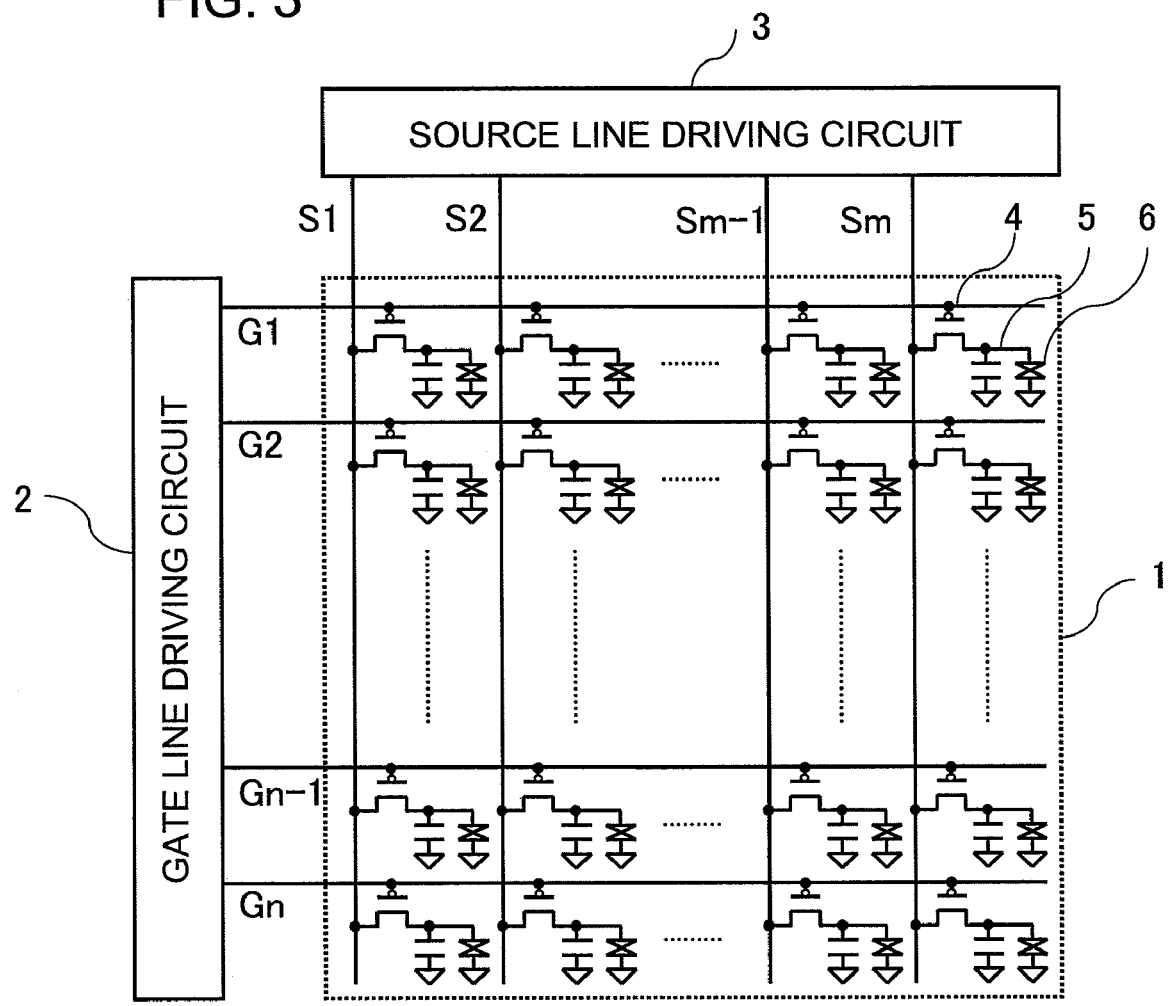
FIG. 3 is a block diagram showing a configuration of an exemplary embodiment of a liquid crystal display according to the present invention.

An Example 1 of a display device according to the present invention will now be described. FIG. 3 depicts a block diagram showing a configuration of an Example of a liquid crystal display according to the present invention.

Referring to FIG. 3, a liquid crystal display of the preset Example includes a pixel part 1, a scanning (gate line) driving circuit 2 and a picture signal (source) line driving circuit 3. In the present Example, the pixel part 1, gate line driving circuit 2 and the source line driving circuit 3 are formed on one and the same glass substrate, although this is not meant to restrict the present invention.

On the pixel part 1, there are formed a plurality of gate lines G1 to Gn and a plurality of source lines S1 to Sm intersecting the gate lines. It is observed that the gate lines G1 to Gn are connected to output terminals of the gate line driving circuit 2, while the source lines S1 to Sm are connected to output terminals of the source line driving circuit 3.

On the pixel part 1, a pixel circuit including a pixel transistor 4, which is a p-channel transistor, a pixel storage capacitor 5 and a liquid crystal pixel capacitance 6, is arranged at each of intersections of the gate lines G1 to Gn and the source lines S1 to Sm.

The gate line driving circuit 2 includes a shift register composed of a plurality of bootstrap circuits. The transistors that make up the shift register may be fabricated by the same production process as that for the pixel transistor 4. The shift register includes a plurality of circuits, each of which is constructed in a manner shown in FIG. 1 and FIG. 2.

When a vertical start pulse ST and a clock signal are externally supplied to the gate line driving circuit 2, the shift register delivers an output signal OUT which is a vertical start pulse signal ST phase-shifted, stage by stage, in synchronization with a clock signal. This causes pixel transistors 4 of the pixel circuits, connected to the common gate line, to be conductive to capture picture signals output on the source lines into the pixel circuits.

The source line driving circuit 3 includes a shift register and a plurality of analog switches and is constituted by transistors fabricated by the same process as the pixel transistors. The shift register includes a plurality of circuits each of which has been explained with reference to FIG. 1 and FIG. 2.

Each shift register stage of the source line driving circuit 3 sequentially shifts a horizontal start pulse externally supplied, by a clock signal, and delivers an output to the relevant analog switch. The analog switch samples the picture signal externally supplied, to output the picture signal to the relevant source line. The picture signals, output to the source lines, are written in the pixels activated by the gate line driving circuit 2. The source line driving circuit 3 is not restricted to this constitution and may be composed by a monocrystalline silicon IC by COG mounting on the same substrate.

Figure 4:
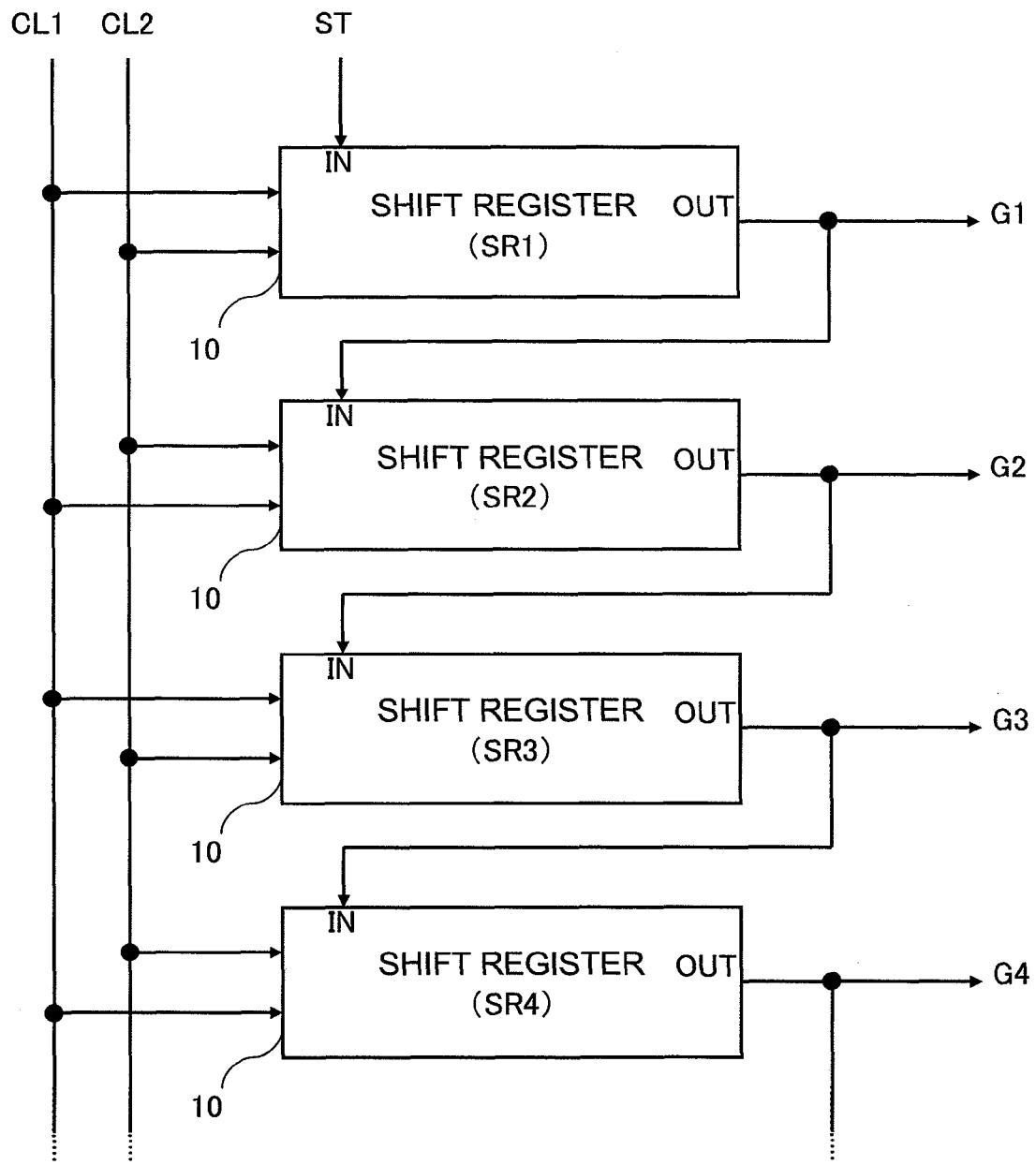
FIG. 4 is a block diagram showing an example configuration of the gate line driving circuit of FIG. 3.

FIG. 4 shows an example configuration of the gate line driving circuit 2 of FIG. 3. Referring to FIG. 4, two clock signals (CL1, CL2) and a vertical start pulse signal ST are externally supplied from outside of the gate line driving circuit 2. The gate line driving circuit includes a plurality of shift register stages 10 (SR1, SR2, SR3, SR4 and so forth) connected in series.

The initial stage shift register stage SR1 delivers, responsive to the clock signal CL1, an output signal OUT (G1), which is the vertical start pulse signal ST phase-shifted by one-half clock.

The next shift register stage SR2 delivers, responsive to the clock signal CL2, an output signal OUT (G2), which is a phase-shifted output of the shift register stage SR1. Thus, the vertical start pulse is sequentially transferred as the output is phase-shifted in synchronization with the clock signal.

Figure 5:
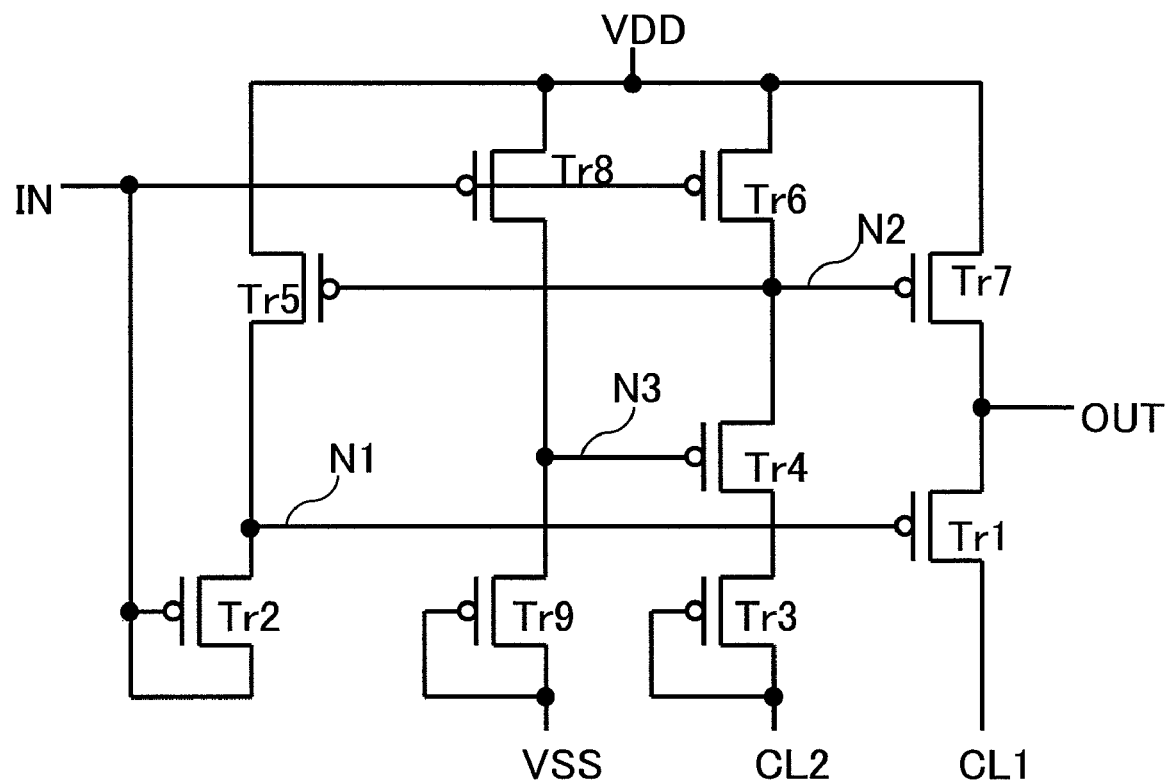
FIG. 5 is a circuit diagram of a bootstrap circuit that constitutes a shift register stage of FIG. 4.

FIG. 5 is a block diagram showing the configuration of the shift register stage SR1 of FIG. 4. Referring to FIG. 5, the shift register stage SR1 comprises the bootstrap circuit shown in FIG. 1. It is noted however that, in FIG. 5, the inverter circuit 100 of FIG. 1 is composed by p-channel transistors Tr8 and Tr9. The shift register stage SR1 is supplied with the vertical start pulse ST as the input signal IN and outputs an output signal OUT to the gate line G1.

In the shift register stages SR2, SR3, SR4 and so forth, on the succeeding side of the shift register stage SR1, only input signals are changed. The circuit configuration of each of the shift register stages SR2, SR3, SR4 and so forth is the same as that shown in FIG. 5.

Specifically, the shift register stage SR2 is supplied with the output signal OUT (G1) of the preceding stage as the input signal IN, in place of the vertical start pulse signal ST which is the input signal IN of the shift register stage SR1. Moreover, the shift register stage SR2 is supplied with the clock signal CL2 as an input in place of the clock signal CL1 and with the clock signal CL1 as an input in place of the clock signal CL2. Thus, with odd shift register stages SR1, SR3 and so forth, clock signals CL1 and CL2 are respectively supplied to the transistors Tr1 and Tr3 in FIG. 5. With even shift register stages SR2, SR4 and so forth, clock signals CL1 and CL2 are respectively supplied to the transistors Tr3 and Tr1.

With the ensuing shift register stages, the output signals OUT of respective preceding stages are delivered as input signals IN and, with each one-stage step, the input clock signals are interchanged.

Referring to FIG. 5, the shift register stage SR1 includes nine p-channel transistors Tr1 to Tr9. The transistor Tr2 is rendered conductive when the vertical start pulse signal ST is LOW. The voltage at the node N1 is higher than the LOW level by the threshold value (VSS+Vt). With the node N1 at this voltage, the transistor Tr1 is rendered conductive.

When the vertical start pulse signal ST is LOW, the transistor Tr8 is rendered conductive to cause the current to flow through the transistor Tr9 to bring the voltage at the node N3 to near the HIGH level. In order for the transistor Tr4 to be non-conducting at this voltage, the current driving capability of the transistor Tr8 is set so as to be higher than that of the transistor Tr9.

When the vertical start pulse signal ST is LOW, the transistor Tr6 is rendered conductive to supply a HIGH level to the node N2. When the node N2 is at a low voltage, the transistor Tr7 is rendered conductive to deliver a HIGH level voltage (power supply voltage VDD) as the output signal OUT. When the node N1 is at a low voltage (at VSS+Vt or at a bootstrap voltage lower than the LOW level), the transistor Tr1 is rendered conductive to deliver a voltage of the clock signal C11 at the output terminal OUT.

The transistors Tr7 and Tr1 drive the load connected to the output terminal OUT. The current driving capabilities of the transistors Tr7 and Tr1 are raised by setting their channel widths are set so as to be larger at least by one order of magnitude than those of the other transistors Tr2 to Tr5, Tr8 and Tr9.

When the voltage at the node N2 is low (VSS+Vt), the transistor Tr5 is rendered conductive to set the node N1 to HIGH level. When the node N3 is at a low voltage, the transistor Tr4 is rendered conductive to deliver the LOW level of the clock signal CL2 via the transistor Tr3 to the node N2. When the clock signal CL2 is at a LOW level, the transistor Tr3 is rendered conductive. If the transistor Tr4 is in a conducting state, at this time, a voltage higher than the LOW level by two threshold values is supplied to the node N2. With this voltage supplied to the node N2, the transistor Tr5 is rendered conductive to set the node N1 to a HIGH level (VDD) to render the transistor Tr1 non-conductive.

In the shift register composed by the bootstrap circuit according to the first exemplary embodiment, the transistor Tr1 is rendered non-conductive by the clock signal (CL1, or CL2), in place of the output signal of the succeeding stage to make the reset signal needed for the last stage shift register unnecessary. By applying the shift register composed by the bootstrap circuit according to the first exemplary embodiment to a driving circuit in a display device and so forth, the number of signal lines and the number of circuit elements can be reduced to achieve the reduction in size and cost of the device.

Figure 6:
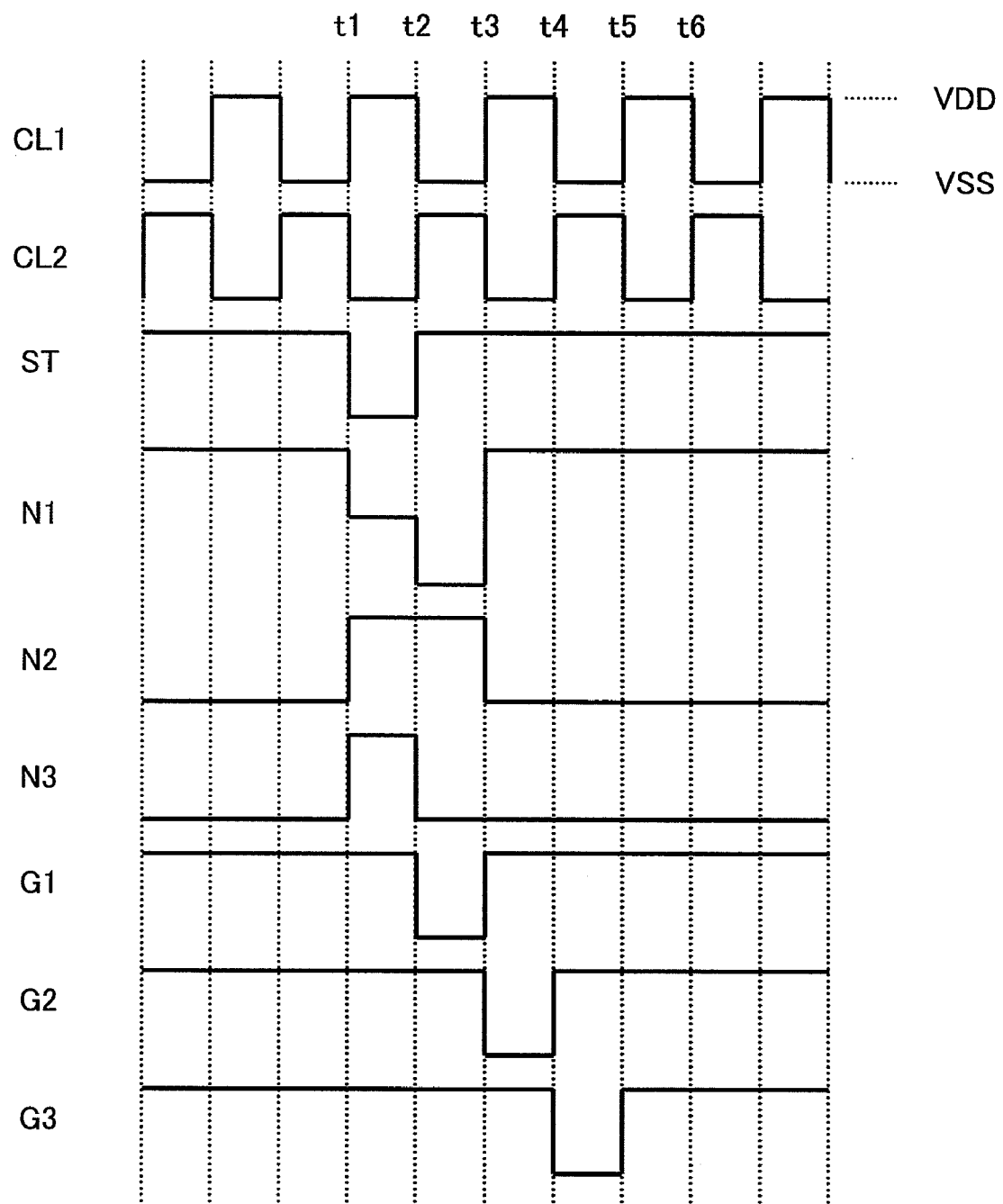
FIG. 6 is a timing chart for illustrating the operation of the shift register stage of FIGS. 4 and 5.

The operation of the shift register of the first exemplary embodiment will now be described. FIG. 6 is a timing chart showing the operation of the shift register shown in FIGS. 4 and 5. The timing chart shows voltage waveforms of the clocks CL1 and CL2, start pulse ST, nodes N1 to N3 within each shift register stage and outputs G1 to G3 of the shift register stages SR1 to SR3. In FIG. 6, the HIGH level voltage and the LOW level voltage of each of the clock signals CL1 and CL2 and the vertical start pulse signal ST are VDD and VSS, respectively. Referring to FIG. 6, the operation of the shift register SR1 will now be described.

When the vertical start pulse signal ST is LOW at time t1, the transistor Tr2 is rendered conductive. The voltage at the node N1 changes to a voltage higher than the LOW level of the input signal IN by the threshold voltage. Since the transistor Tr6 is also rendered conductive, the voltage at the node N2 changes to a HIGH level. With the node N2 at the HIGH level, the transistors Tr5 and Tr7 are rendered non-conductive.

The transistor Tr8 is rendered conductive to set the voltage at the node N3 at a value close to the HIGH level to render the transistor Tr4 non-conductive. Since the transistor Tr4 is in a non-conductive state, the LOW level of the clock signal CL2 is not delivered via the transistor Tr3 to the node N2.

The node N1 is at a low voltage so that the transistor Tr1 is rendered conductive. However, since the clock signal is at a HIGH level, the output signal OUT continues to be HIGH.

At time t2, the clock signal CL2 transitions to a HIGH level, while the clock signal CL1 transitions to a LOW level. Then, since there exist capacitances between the gate and drain electrodes and between the gate and source electrodes of the transistor Tr1, the voltage at the node N1 is pulled down to a value further lower than VSS+Vt by the bootstrap effect. The voltage is thus lower than the LOW level.

As a result, the voltage greater than or equal to the threshold voltage is applied across the gate and the source of the transistor Tr1. Hence, the transistor Tr1 is kept in its conducting state, so that the LOW level of the clock signal CL1 is output as the output signal OUT (G1).

Since the vertical start pulse signal ST has been changed to a HIGH level, the transistor Tr8 is rendered non-conductive. The voltage at the node N3 changes by the transistor Tr9 to a value higher than the LOW level by a threshold value to render the transistor Tr4 conductive.

The transistor Tr4 changes to a conducting state. However, since the clock signal CL2 is at a HIGH level, the transistor Tr3 is non-conductive, so that the HIGH level of the clock signal CL2 is not transferred to the node N2.

At a time t3, the clock signal CL2 transitions to a LOW level, while the clock CL1 transitions to a HIGH level. The transistor Tr3 then changes to its conducting state. Since the transistor Tr4 is also in its conducting state, the voltage at the node N2, which has been at a HIGH level, changes to a value higher than the LOW level by two threshold values (VSS+2Vt).

As a result, the transistors Tr5 and Tr7 change to conducting states. The condition under which the transistors Tr5 and Tr7 change to conducting states is:

$$(VDD-Vt) \geq (VSS+2Vt).$$

Since the transistor Tr1 has now been rendered conductive, the voltage at the node N1, which has been lower than the LOW level by the bootstrap effect, changes to a HIGH level.

Since the transistor Tr7 has been rendered conductive, the output signal OUT (G1) changes to a HIGH level.

Since the node N1 has become HIGH, the transistor Tr1 changes to the non-conducting state.

From time t3, the LOW level of the clock signal CL2 is applied to the transistor Tr3 at a constant period. The transistor Tr4 also is conductive, so that the low voltage (VSS+2Vt) continues to be delivered to the node N2 at a clock period.

As a result, the transistors Tr5 and Tr7 continue to stay in the conducting states. Hence, the output signal OUT (G1) continues to be HIGH, while the node N1 also continues to be HIGH. This condition is unchanged until the LOW level of the next vertical start pulse signal ST is supplied as an input.

It is now assumed that the leakage currents of the transistors Tr6 to Tr3 amount to larger values. If the leakage currents are of larger values, the voltage (VSS+Vt) of the node N2, once written at time t3 to t4, increases during the time between t4 and t5.

However, a low voltage at the node N2 (VSS+2Vt) is again supplied to the node N2 between time t5 and time t6. When the clock signal CL1 becomes LOW at time t6, the LOW level of the clock signal CL1 is not output from the transistor Tr1 to the output OUT (G1), because such a voltage that renders the transistor Tr1 non-conductive is supplied to the transistor Tr1. Hence, there arises no problem of circuit malfunctioning.

The operation of the shift register stage SR1 has been described above. The operation of all of the shift register stages SR2, SR3, SR4 and so forth, other than the shift register stage SR1, is similar to that described above, except that the input signal changes from stage to stage. As a result, the vertical start pulse signal ST is output, as it sequentially undergoes phase shifting, such as to drive the gate lines G1, G2, G3 and so forth.

The pixel transistors, connected to the activated gate line, are rendered conductive, so that picture signals delivered from the source line driving circuit are written in the pixels. This operation is executed from one gate line to the next to display a picture on the pixel part 1.

Exemplary Embodiment 2

Figure 7:
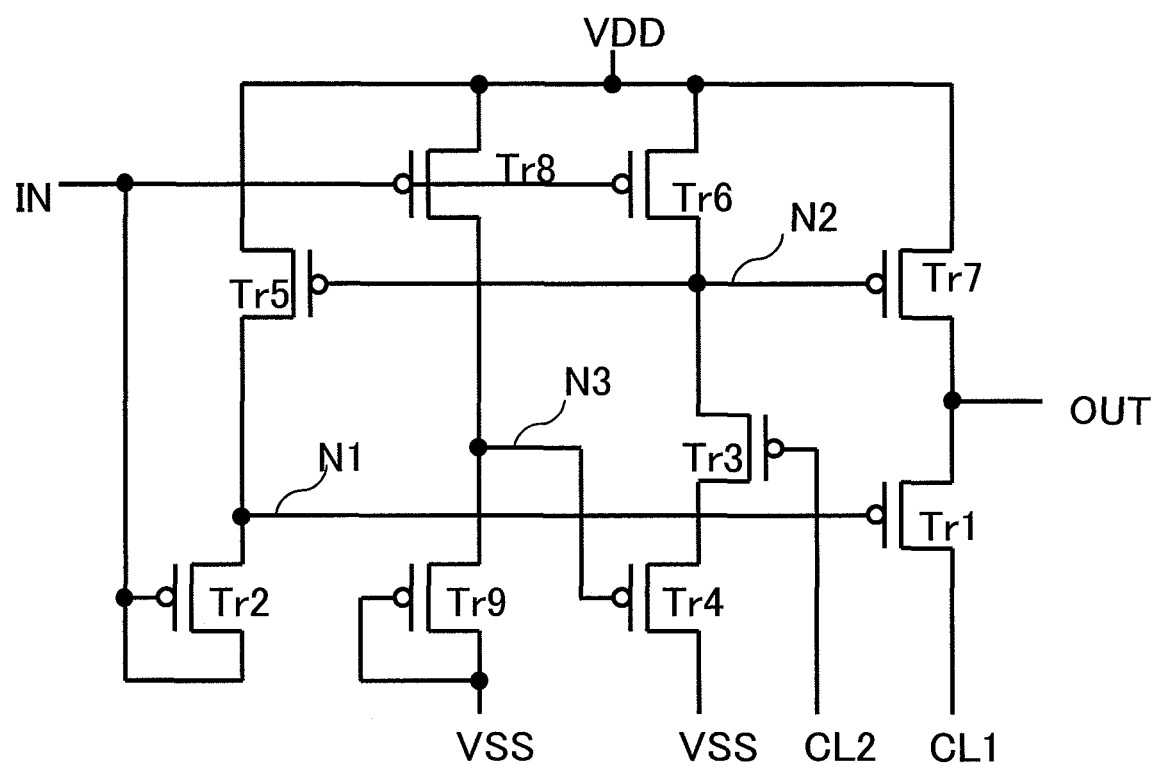
FIG. 7 is a circuit diagram of a bootstrap circuit according to a second exemplary embodiment of the present invention.

A second exemplary embodiment of the present invention will now be described. In this exemplary embodiment, the bootstrap circuit, making up each shift register stage of the present invention, differs from that of the first exemplary embodiment described above. FIG. 7 shows a configuration of a bootstrap circuit.

Referring to FIG. 7, connection between transistors Tr4 and Tr3 is modified from that of the first exemplary embodiment (FIG. 5). The transistor Tr3 is connected to the node N2, and the transistor Tr4 is connected in series with the transistor Tr3. The connection terminal of the transistor Tr4, opposite to its connection terminal to the transistor Tr3, is connected to VSS. A second clock signal CL2 is coupled to the gate electrode of the transistor Tr3.

In FIG. 7, the transistor Tr4 is connected to VSS. It is however also possible to connect the transistor to the node N3, the gate electrode of the transistor is connected to, instead of connecting the transistor to VSS.

In FIG. 7, there is shown an initial shift register stage SR1 like FIG. 5. The succeeding shift register stages SR2, SR3, SR4 and so forth are similar in configuration to those of the embodiment described above.

The circuit configuration of the succeeding shift register stages is the same as that of the shift register stage SR1 of FIG. 7. In more detail, the shift register stage SR2 is not supplied with the vertical start pulse signal ST. Instead, the shift register stage SR2 is supplied with an output signal OUT (G1) of the shift register stage SR1, as an input signal IN. In addition, the transistor Tr1 of the shift register stage SR2 is supplied with the clock signal CL2 instead of with the clock signal CL1, while the transistor Tr2 being supplied with the clock signal CL1 instead of with the clock signal CL2. The further succeeding side shift registers are supplied with output signals OUT of the respective preceding stages, as input signals IN and, for each stage step, the input clock signals are interchanged.

According to the shift register composed by the bootstrap circuit according to the second exemplary embodiment, since the transistor Tr1 is rendered non-conductive by the clock signal (CL1, or CL2), in place of the output signal of the succeeding stage, the effects and advantages equivalent to as those of the first exemplary embodiment can be achieved.

The operation of the shift register is the same as that of the first exemplary embodiment described above. The transistor Tr4 is rendered conductive when the node N3 is low and, when the clock signal CL2, supplied to the transistor Tr3, is LOW, the transistor Tr4 supplies the LOW level to the node N2.

In actuality, the voltage delivered to the node N2 is of a value higher than the LOW level by two threshold values. When this voltage is supplied to the node N2, the transistor Tr5 is rendered conductive to supply the HIGH level (VDD) to the node N1 to render the transistor Tr1 non-conductive. The operation of this exemplary embodiment is the same as shown in the timing chart shown in FIG. 6. The meritorious effect of this exemplary embodiment is the same as that of the first exemplary embodiment.

Exemplary Embodiment 3

The third exemplary embodiment of the present invention will now be described. In the third exemplary embodiment, each shift register stage is made up of a plurality of n-channel transistors. A liquid crystal display that uses this shift register stage for the gate line driving circuit 2 is shown in FIG. 3. The block diagram of the shift register stage is similar to that shown in FIG. 4. In case the gate line driving circuit 2 is formed by n-channel transistors, the pixel transistors 4 of the pixel part 1 are also formed by n-channel transistors.

Figure 8:
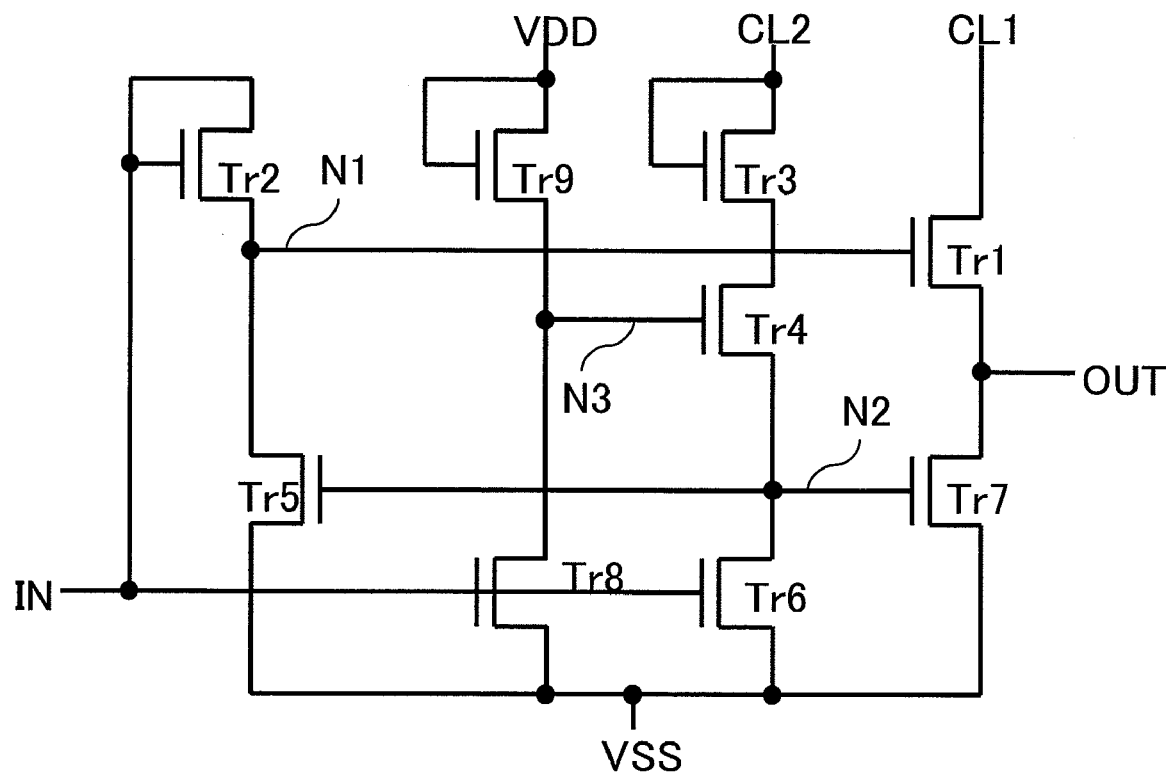
FIG. 8 is a circuit diagram of a bootstrap circuit according to a third exemplary embodiment of the present invention.

Referring to FIG. 8, the shift register stage of the third exemplary embodiment of the present invention will be described. FIG. 8 shows the configuration of the initial shift register stage SR1, as in Example 1 described above. Further downstream side stages are as described in connection with the Examples 1 and 2.

The shift register stage SR1, shown in FIG. 8, includes nine n-channel transistors Tr1 to Tr9. When the vertical start pulse signal ST is HIGH, the transistor Tr2 is rendered conductive to transfer a voltage lower than the HIGH level by a threshold value (VDD−Vt) to a node N1. When this voltage is supplied to the node N1, the transistor Tr1 is rendered conductive. Although the input signal IN is coupled to the drain terminal and the gate electrode of Tr2, in FIG. 8, the drain terminal may also be connected to the power supply VDD which is equal in voltage value to the HIGH level.

The voltage of the HIGH level may differ from that of the power supply VDD. When the vertical start pulse signal ST is HIGH, the transistor Tr8 is rendered conductive to cause the current to flow through the transistor Tr9 to set a node N3 to a voltage close to the LOW level. The current driving capability of the transistor Tr8 is set so as to be higher than that of the transistor Tr9 so that the transistor Tr4 will be non-conductive at this voltage of the node N3. When the vertical start pulse signal ST is HIGH, the transistor Tr6 is rendered conductive to transfer the LOW level to the node N2.

When the node N2 is HIGH, the transistor Tr7 is rendered conductive to deliver a LOW level voltage VSS to the output signal OUT (G1). When the node N1 is at a high voltage (VDD−Vt) or a bootstrap voltage further higher than the HIGH level, the transistor Tr1 is rendered conductive to deliver the voltage of a clock CL1 as an output signal OUT (G1).

Since the transistors Tr7 and Tr1 drive the load connected to the output OUT, the current driving capabilities of these transistors are raised by setting their channel widths so as to be larger than those of the transistors Tr2 to Tr6, Tr8 and Tr9 by at least one order of magnitude. When the node N2 is at a high voltage (VDD−Vt), the transistor Tr5 is rendered conductive to supply the LOW level to the node N1.

When the node N3 is HIGH, the transistor Tr4 is rendered conductive to deliver the HIGH level of the clock signal CL2 to the node N2 via the transistor Tr3.

When the clock signal CL2 is HIGH, the transistor Tr3 is rendered conductive. If the transistor Tr4 is in its conducting state, a voltage lower than the HIGH level by two threshold values (VDD−2Vt) is supplied to the node N2. With this voltage supplied to the node N2, the transistor Tr5 is rendered conductive to supply the LOW level to the node N1 to render the transistor Tr1 non-conductive.

Although the clock signal CL2 is coupled to the drain terminal and the gate electrode of the transistor Tr3, the drain terminal may also be connected to the power supply terminal VDD.

According to the shift register composed by the bootstrap circuit according to the second exemplary embodiment, since the transistor Tr1 is rendered non-conductive by the clock signal (CL1, or CL2), in place of the output signal of the succeeding stage, the effects and advantages equivalent to as those of the first exemplary embodiment can be achieved.

Figure 9:
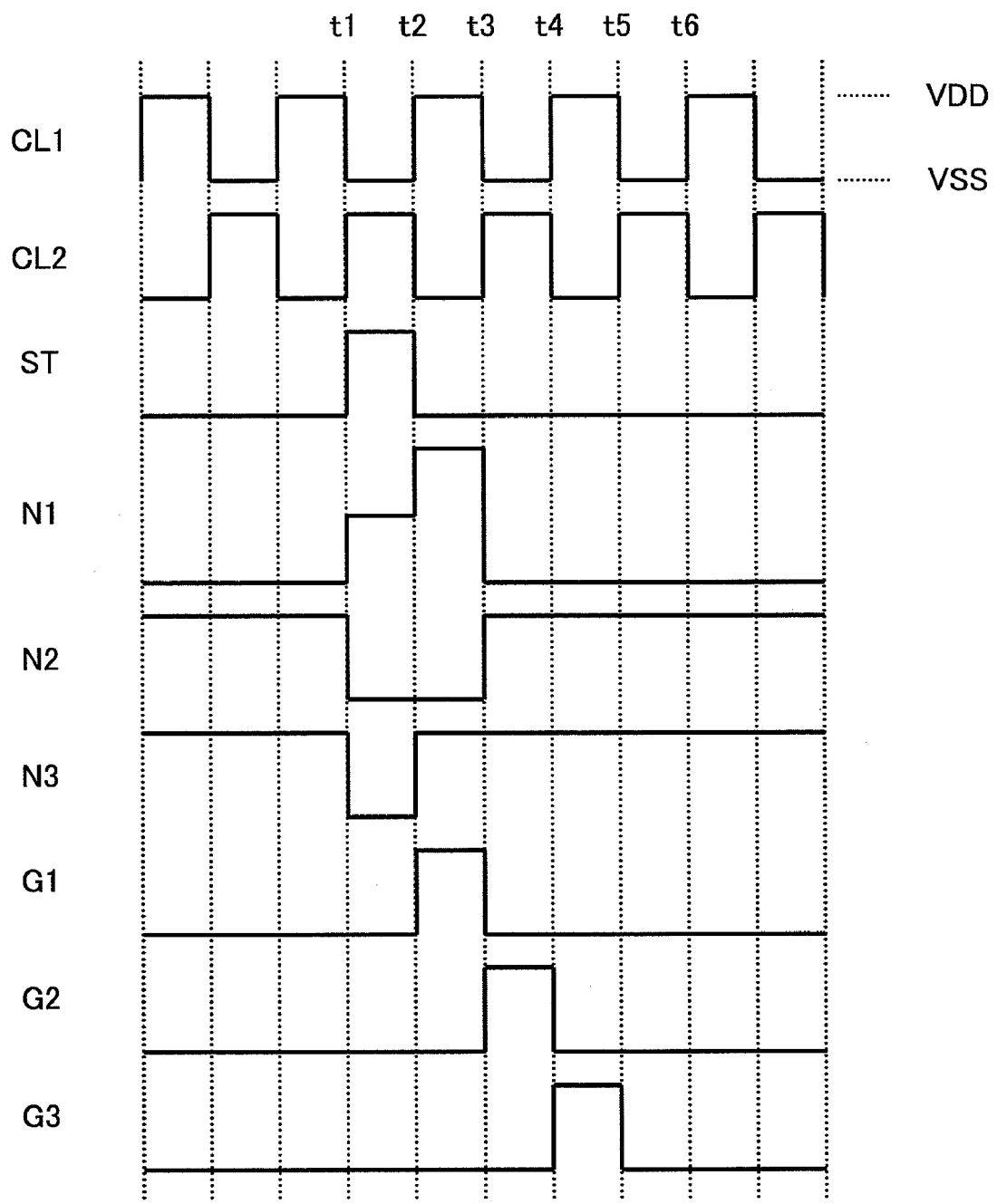
FIG. 9 is a timing chart for illustrating the operation of the shift register stage of FIG. 8.

The operation of the shift register stage of the Example 3 of the present invention will now be described. FIG. 9 depicts a timing chart showing the operation of the shift register stage of FIG. 8. In FIG. 9, the HIGH level voltage of the clock signals CL1, CL2 and the vertical start pulse signal ST is VDD, while the LOW level voltage thereof is VSS. The operation of the shift register stage SR1 will now be described with reference to FIG. 9.

When the vertical start pulse signal ST is HIGH at time t1, the transistor Tr2 is rendered conductive. The voltage at the node N1 changes to a voltage lower than the HIGH level of the input signal IN by a threshold value (VDD−Vt). Since the transistor Tr6 is also rendered conductive, the voltage at the node N2 changes to the LOW level. With the node N2 in the LOW level, the transistors Tr5 and Tr7 are rendered non-conductive. Since the transistor Tr8 is also rendered conductive, the voltage at the node N3 is close to the LOW level to render the transistor Tr4 non-conductive. Since the transistor Tr4 is rendered non-conductive, the HIGH level of the clock signal CL2 is not transferred to the node N2 via the transistor Tr3. With the node N1 at the HIGH voltage, the transistor Tr1 is rendered conductive. However, since the clock signal CL1 is LOW, the output signal OUT (G1) is kept at the LOW level.

At time t2, the clock signal CL2 changes to the LOW level, while the clock signal CL1 changes to the HIGH level. Since there exist capacitances between the gate and drain electrodes and between the gate and source electrodes of the transistor Tr1, the voltage at the node N1 is pulled up to a voltage further higher than VDD−Vt, due to the bootstrap effect, by the respective capacitances. The voltage at the node n1 is thus higher than the HIGH level.

As a result, a voltage higher than the threshold voltage is applied across the gate and the source of the transistor Tr1. The transistor Tr1 thus continues to be conductive to deliver the HIGH level of the clock signal CL1 as the output signal OUT (G1).

At this time, the vertical start pulse signal ST has been changed to the LOW level. By the transistor Tr9, the voltage at the node N3 changes to a value lower than the HIGH level by the threshold voltage to render the transistor Tr4 conductive. Even though the transistor Tr4 is rendered conductive, the transistor Tr3 remains non-conductive because the clock signal CL2 is LOW. The LOW level of the clock signal CL2 is thus not delivered to the node N2.

At time t3, the clock signal CL2 changes to the HIGH level, with the clock signal CL1 being changed to the LOW level. The transistor Tr3 is now rendered conductive. Since the transistor Tr4 is also conductive, the LOW voltage at the node N2 is now changed to a level lower than the HIGH level by two threshold values (VDD−2Vt).

As a result, the transistors Tr5 and Tr7 are rendered conductive. With the transistor Tr5 being conductive, the voltage at the node N1, which has so far been higher than the HIGH level due to the bootstrap effect, falls to the LOW level. Also, since the transistor Tr7 is rendered conductive, the output signal OUT (G1) falls to the LOW level. Since the node N1 has been changed to the LOW level, the transistor Tr1 is rendered non-conductive.

From time t3 on, the HIGH level of the clock signal CL2 is applied to the transistor Tr3 at a constant period. The transistor Tr4 also is conductive, so that a HIGH voltage (VDD−2Vt) continues to be delivered to the node N2 at a clock period. As a result, the transistors Tr5 and Tr7 are kept in the conducting states. Hence, the output signal OUT (G1) continues to be LOW, while the node N1 also continues to be LOW. This condition is unchanged until the HIGH level of the next vertical start pulse signal ST is supplied as an input.

The operation of the shift register stage SR1 has been described above. The operation of the shift register stages, other than the shift register stage SR1, that is, SR2, SR3, SR4 and so forth, is similar to that described above, except that that the input signal changes from stage to stage. As a result, the vertical start pulse signal ST is output, as it sequentially undergoes phase shifting, such as to drive the gate lines G1, G2, G3 and so forth.

As described above, the shift register stage of the present invention may be constructed using n-channel transistors, and a liquid crystal display device may also be constructed using the shift register stage for the gate line driving circuit. The transistors Tr4 and Tr3, explained in connection with the second exemplary embodiment, may also be interchanged, in which case the operation shown in the timing chart of FIG. 9 as well as the resulting meritorious effect may similarly be achieved.

Exemplary Embodiment 4

Figure 10:
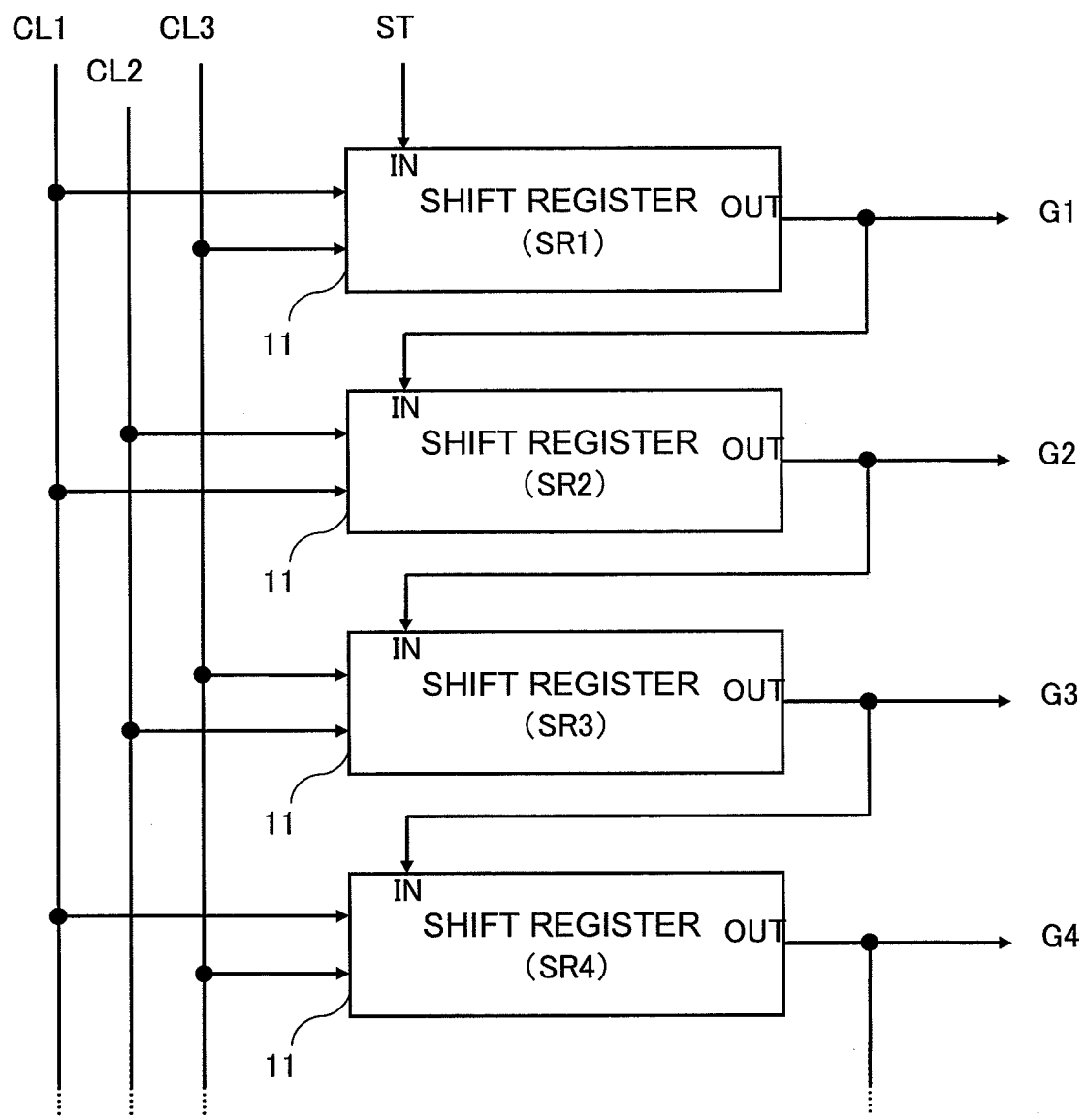
FIG. 10 is a block diagram showing a shift register stage according to a fourth exemplary embodiment of the present invention.

A fourth exemplary embodiment of the present invention will now be described. This fourth exemplary embodiment of the present invention is similar to the exemplary embodiment, described above, except the bootstrap circuit constituting a shift register stage of the present invention. FIG. 10 is a block diagram of the shift register stage.

Referring to FIG. 10, each shift register stage of the present Example uses three-phase clock signals. A shift register stage SR1 is supplied with a first phase clock signal CL1 and a third phase clock signal CL3, as first and second clock signals, respectively, and a shift register stage SR2 is supplied with a second phase clock signal CL2 and a first phase clock signal CL1, as first and second clock signals, respectively. A shift register stage SR3 is supplied with a third phase clock signal CL3 and a second phase clock signal CL2, as first and second clock signals, respectively, and a shift register stage SR4, like the shift register stage SR1, is supplied with a first phase clock signal CL1 and a third phase clock signal CL3, as first and second clock signals, respectively.

Figure 11:
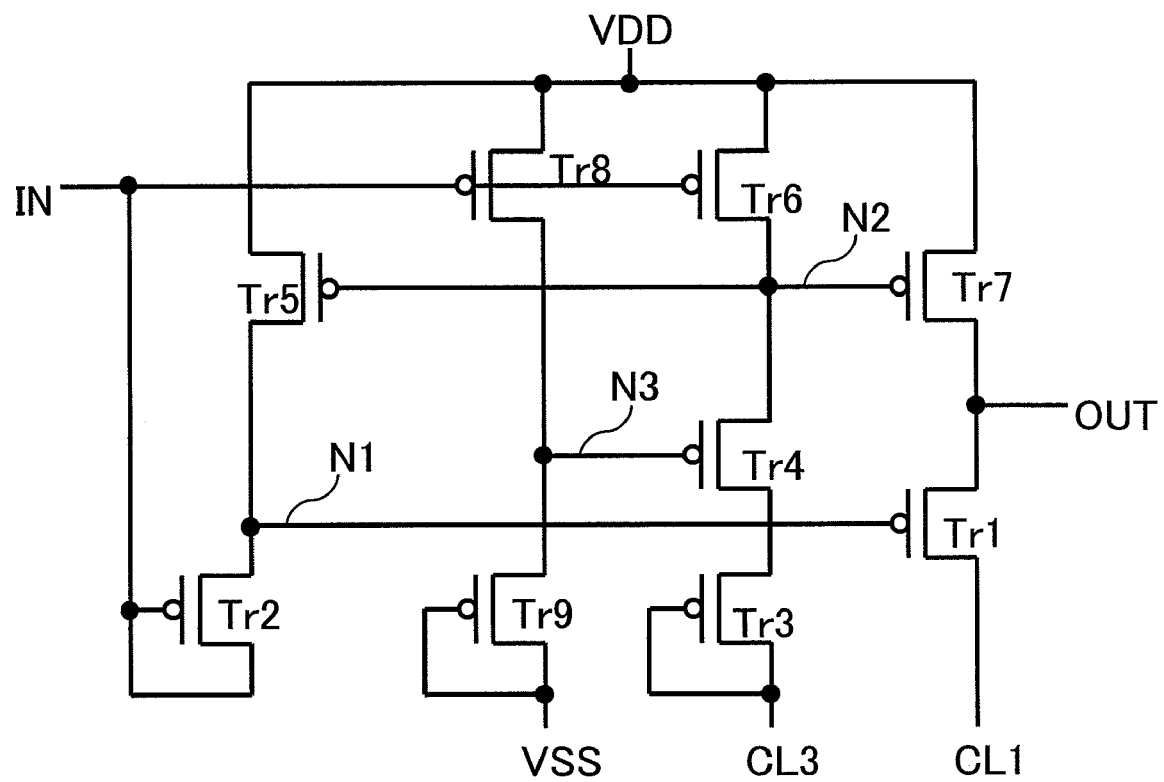
FIG. 11 is a circuit diagram of a bootstrap circuit constituting the shift register stage according to the fourth exemplary embodiment of the present invention.

FIG. 11 shows a configuration of the shift register stage SR1. The present embodiment differs from the first embodiment as to the clock signal coupled to the transistor Tr3, because the three-phase clock signals are used.

The clock signal, supplied to the transistor Tr3, is the clock signal CL3 that has a phase lead of one phase (or a phase lag of two phases) with respect to the clock signal CL1 supplied to the transistor Tr1.

The ensuing shift register stages SR2, SR3, SR4 and so forth are the same in circuit configuration as the shift register stage SR1 of FIG. 11 except that the input signal changes from stage to stage. Specifically, the clock signals CL2 and CL1 are supplied, in place of the clock signals CL1 and CL3, respectively, to the shift register stage SR2.

The clock signals CL3 and CL2 are supplied, in place of the clock signals CL1 and CL3, respectively, to the shift register stage SR3.

Thus, as the shift register stage is traversed one by one stage, the clock signals, each with one phase lag, are supplied as inputs. The same holds for the shift registers of stages succeeding to SR4. The clock signals, supplied to the shift register SR4, are the same as those supplied to the shift register SR1.

If the clock signal is a multi-phase signal having four or more phases, it is only sufficient that the clock signal supplied to the transistor Tr3 has a phase lead of one phase with respect to the clock signal CL1 supplied to the transistor Tr1.

According to the shift register composed by the bootstrap circuit according to the fourth exemplary embodiment, since the transistor Tr1 is rendered non-conductive by the clock signal (CL1, or CL2), in place of the output signal of the succeeding stage, the effects and advantages equivalent to as those of the first exemplary embodiment can be achieved.

Figure 12:
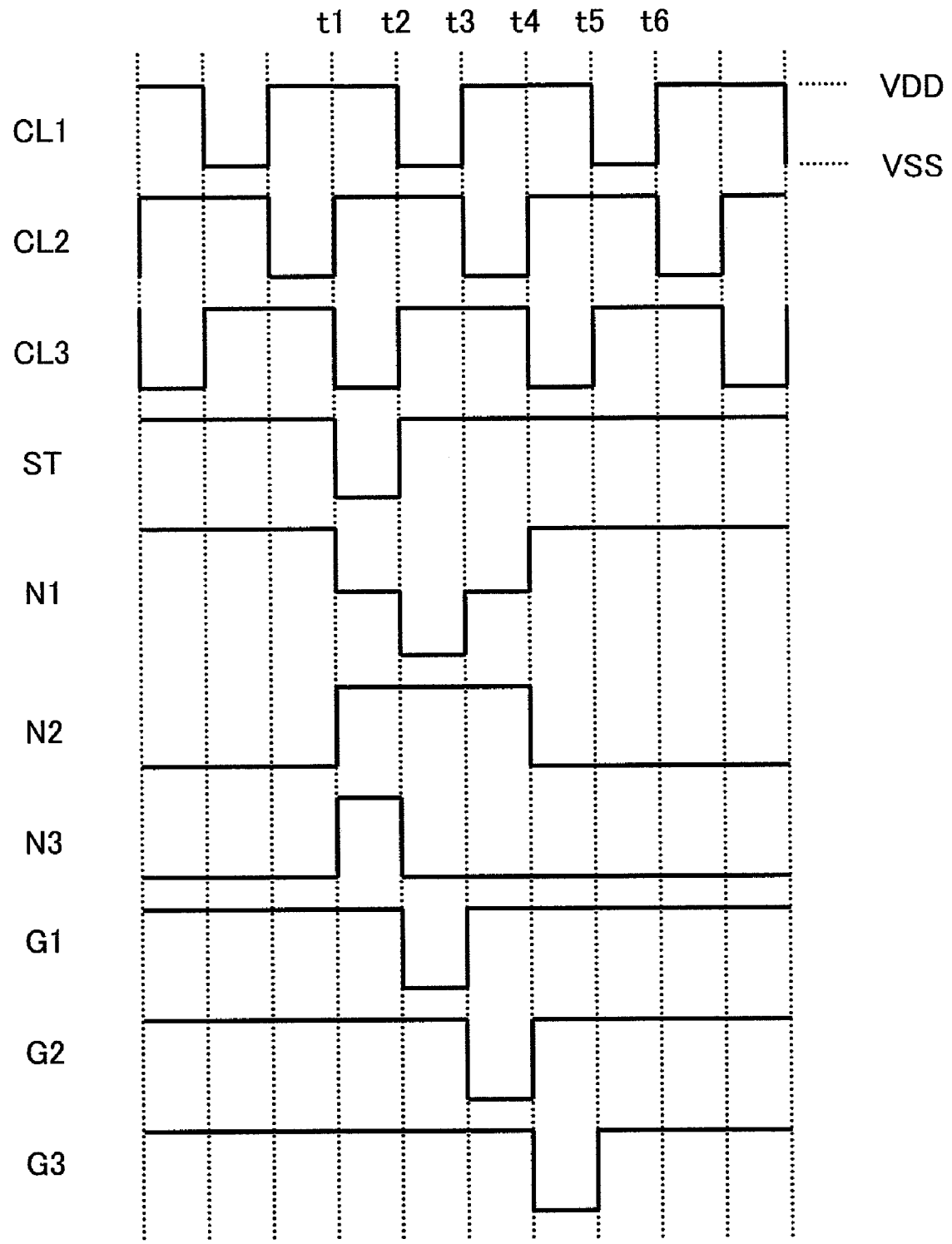
FIG. 12 is a timing chart for illustrating the operation of a shift register stage according to the fourth exemplary embodiment of the present invention.

The operation of the shift register of Example 4 of the present invention will now be described. FIG. 12 depicts a timing chart showing the operation of a shift register stage of Example 4.

In FIG. 12, the HIGH level voltage of the clock signals CL1, CL2 and the vertical start pulse signal ST is VDD, while the LOW level voltage thereof is VSS. Referring to FIGS. 11 and 12, the operation of the shift register stage SR1 will be described.

At time t1, the vertical start pulse signal ST falls to a LOW level. The transistor Tr2 then becomes conductive. The voltage at a node N1 changes to a value higher than the LOW level of the input signal IN by a threshold value (VSS+Vt). Since the transistor Tr6 is also rendered conductive, the node N2 shifts to HIGH level. With the node N2 at the HIGH level, the transistors Tr5 and Tr7 are rendered non-conductive. The transistor Tr8 is also rendered conductive and the node N3 is at a voltage close to the HIGH level to render the transistor Tr4 non-conductive. With the transistor Tr4 in its non-conducting state, the LOW level of the clock signal CL3 is not transferred via the transistor Tr3 to the node N2. Since the transistor Tr6 is conductive, the node N2 changes to the HIGH level. Since the node N1 is at a low voltage, the transistor Tr1 becomes conducive. However, since the clock signal CL1 is HIGH, the output signal OUT (G1) is kept at HIGH level.

At time t2, the clock signal CL3 changes to HIGH level, with the clock signal CL1 changing to LOW level. Since there exist capacitances between the gate and drain electrodes and between the gate and source electrodes of the transistor Tr1, the voltage at the node N1 is pulled down to a voltage further lower than VSS+Vt, by the bootstrap effect by the respective capacitances. The voltage at the node N1 thus becomes lower than the LOW level.

As a result, a voltage equal to or higher than the threshold voltage is applied across the gate and the source of the transistor Tr1. Hence, the transistor Tr1 stays in its conducting state, so that the LOW level of the clock signal CL1 is delivered as the output signal OUT (G1).

Since the vertical start pulse signal ST has been changed to the HIGH level, the transistor Tr8 is rendered non-conductive. The transistor Tr9 causes the node N3 to change to a voltage higher by a threshold value than the LOW level to render the transistor Tr4 conductive.

The transistor Tr4 changes to a conducting state. However, since the clock signal CL3 is HIGH, the transistor Tr3 is non-conductive, so that the HIGH level of the clock signal CL3 is not supplied to the node N2.

At time t3, the cock signal CL1 changes to a HIGH level. The voltage at the node N1 then reverts to the voltage VSS+Vt, as set at time t1, by the bootstrap effect. Since the transistor Tr1 is kept in its conducting state, the voltage at the output OUT (G1) transitions to the HIGH level of the clock signal CL1.

At time t4, the clock signal CL3 transitions to the HIGH level. The transistor Tr3 then is rendered conductive. Since the transistor Tr4 is also conductive, the node N2, which has so far been at the HIGH level, changes to a voltage higher by two threshold voltages than the LOW level (VSS+2Vt).

As a result, the transistors Tr5 and Tr7 change to conducting states. With the transistor Tr5 being conductive, the voltage at the node N1 changes to the HIGH level to render the transistor Tr1 non-conductive.

On the other hand, the transistor Tr7 is rendered conductive, and hence the HIGH level is supplied to the output signal OUT (G1) from the transistor Tr7. However, since the voltage is already at the HIGH level, there is caused no voltage change.

As from time t4, the LOW level of the clock signal CL3 is supplied at a constant period to the transistor Tr3. Since the transistor Tr4 is also in its conducting state, a low voltage (VSS+2Vt) continues to be supplied to the node N2 at the clock period.

As a result, the transistors Tr5 and Tr7 are kept in conducting states. Hence, the output OUT (G1) is kept at HIGH level, while the node N1 is also kept at HIGH level. This condition remains unchanged until the LOW level of the next vertical start pulse signal ST is entered.

It is now assumed that the leakage currents of the transistors Tr3, Tr4, and Tr6 amount to larger values. According to the present invention, such a voltage that renders the transistor Tr1 non-conductive is supplied during the time interval of t4-t5, that is, during the time interval when the clock signal CL3 is at LOW level.

It is thus possible to positively maintain the non-conducting state of the transistor Tr1 when the clock signal CL1 becomes LOW at time t5. As a result, the bootstrap effect is not in operation even if the clock signal CL1 changes to the LOW level. Hence, there is no case in which the transistor Tr1 is rendered conductive to deliver the LOW level of the clock signal CL1 to the output. That is, the circuit may be prevented from malfunctioning.

The operation of the shift register stage SR1 has been described above. The operation of all of the shift register stages SR2, SR3, SR4 and so forth, other than the shift register stage SR1, is similar from one stage to the next, except that that the input signals to the stages are changed. As a result, the vertical start pulse signal ST is output, as it sequentially undergoes phase shifting, such as to drive the gate lines G1, G2, G3 and so forth.

The shift register stages of the present invention may cope with a multi-phase clock signal with three or more phases.

Exemplary Embodiment 5

Figure 13:
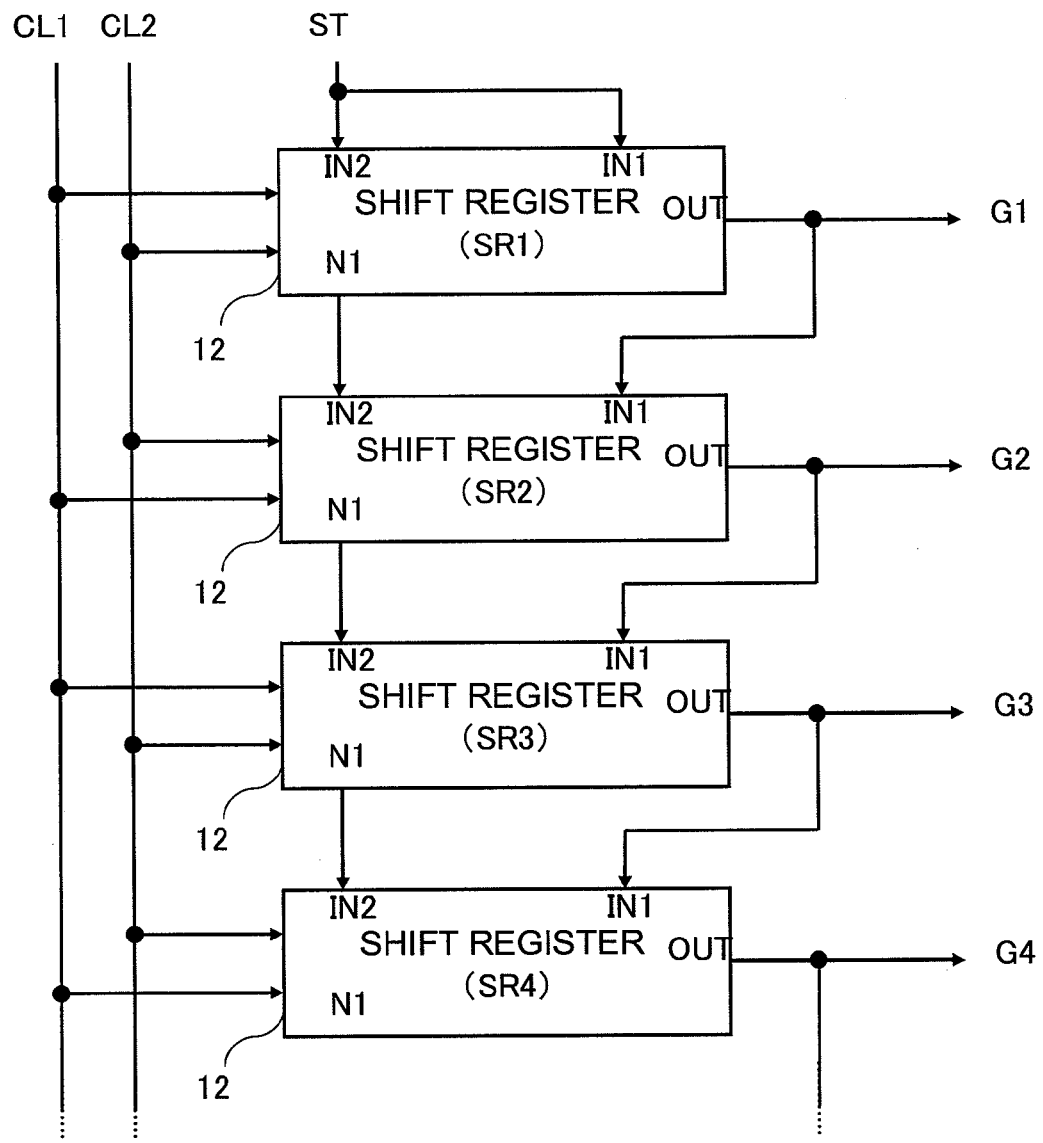
FIG. 13 is a block diagram for illustrating the operation of the shift register stages according to a fifth exemplary embodiment of the present invention.

A fifth exemplary embodiment of the present invention will now be described. FIG. 13 depicts the configuration of shift register stages of the fifth exemplary embodiment. Referring to FIG. 13, a vertical start pulse signal ST is applied, along with clock signals, to the shift register stage SR1, as in the first to fourth exemplary embodiments described above. For the shift register stage SR2 et seq., two sorts of signals, namely output signals OUT and nodes N1 of respective preceding stages, are delivered, along with the clock signals, to the input terminals IN1 and IN2. It is observed that the node N1 is the gate node of the transistor Tr1 of each shift register stage.

Figure 14:
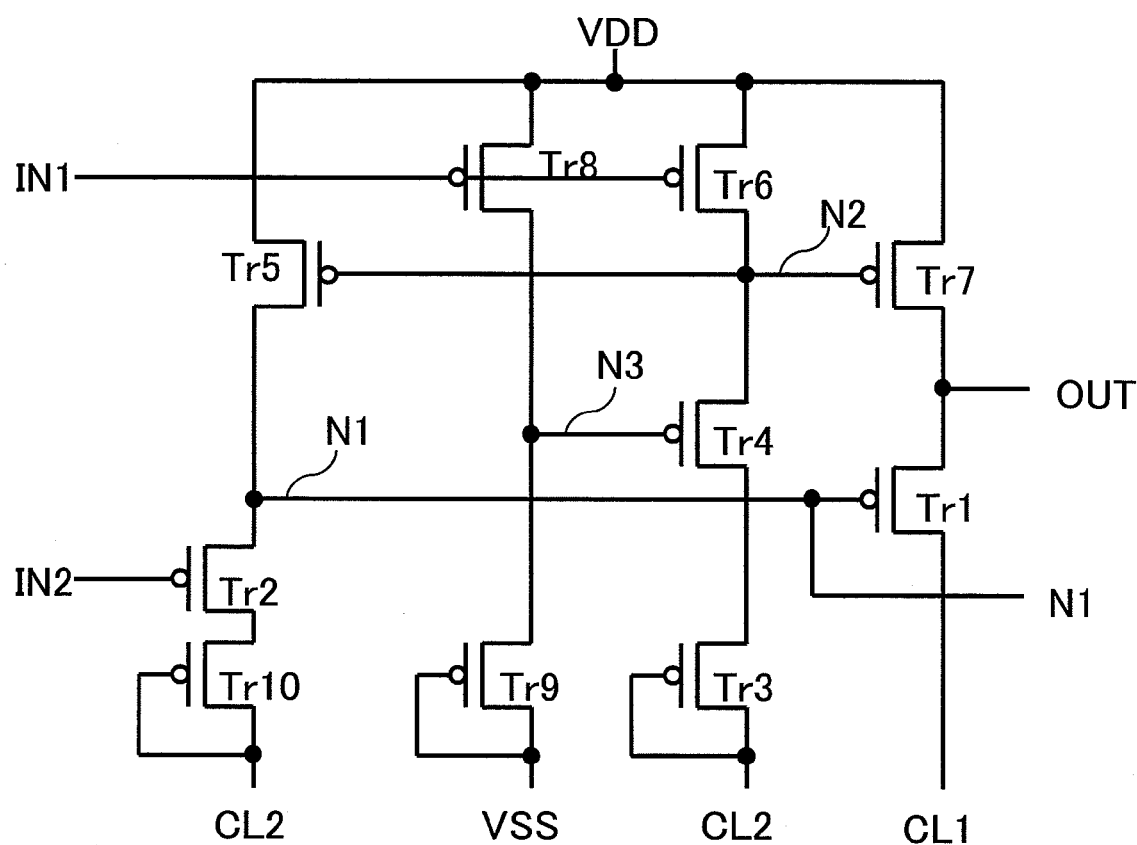
FIG. 14 is a circuit diagram of a bootstrap circuit constituting the shift register stage according to a fifth exemplary embodiment of the present invention.

FIG. 14 shows the configuration of a bootstrap circuit that constitutes the shift register stage 12 of FIG. 13. The configuration of FIG. 14 differs from that of FIG. 5 in that a transistor Tr10 is connected in series with the transistor Tr2, the gate of the transistor Tr2 is connected to the input terminal IN2 and in that the gate and the drain of the transistor Tr10 are connected together and connected to the second clock signal CL2. A signal line connected to the gate electrodes of the transistors Tr6 and Tr8 is isolated from a signal line connected to the gate electrode of the transistor Tr2. In addition, the output terminal OUT and the gate node N1 of the transistor Tr1 (connection node of the transistors Tr5 and Tr2) are taken as outputs and respectively connected to input terminals IN1 and IN2 of the next stage.

In the example shown in FIG. 14, the drain terminal and the gate electrode of the transistor Tr10 are connected to the clock signal CL2. It is however also possible to couple the clock signal only to the gate electrode, and to connect the drain terminal to VSS.

In the shift register stage SR1, the transistor Tr2 becomes conductive when the vertical start pulse signal ST is LOW to deliver the voltage of the clock signal CL2 via the transistor Tr10 to the node N1.

This voltage, supplied to the node N1, renders the transistor Tr1 conductive. If the shift register stage is the shift register stage SR2 et seq., the node N1 of the preceding stage is supplied to the transistor Tr2. This transistor Tr2 is rendered conductive if the node N1 of the preceding stage is at a low voltage. The transistor Tr2 then transmits the LOW level of the clock signal (CL1 or CL2), coupled to the transistor Tr10, via the transistor Tr2, to the node N1. The transistor Tr10 is rendered conductive when the voltage of the clock signal (CL1 or CL2) coupled thereto is at LOW level. Otherwise, the present exemplary embodiment is the same as the first exemplary embodiment described above, and hence the description of the common portions is dispensed with.

According to the shift register composed by the bootstrap circuit according to the fifth exemplary embodiment, since the transistor Tr1 is rendered non-conductive by the clock signal (CL1, or CL2), in place of the output signal of the succeeding stage, the effects and advantages equivalent to as those of the first exemplary embodiment can be achieved.

Figure 15:
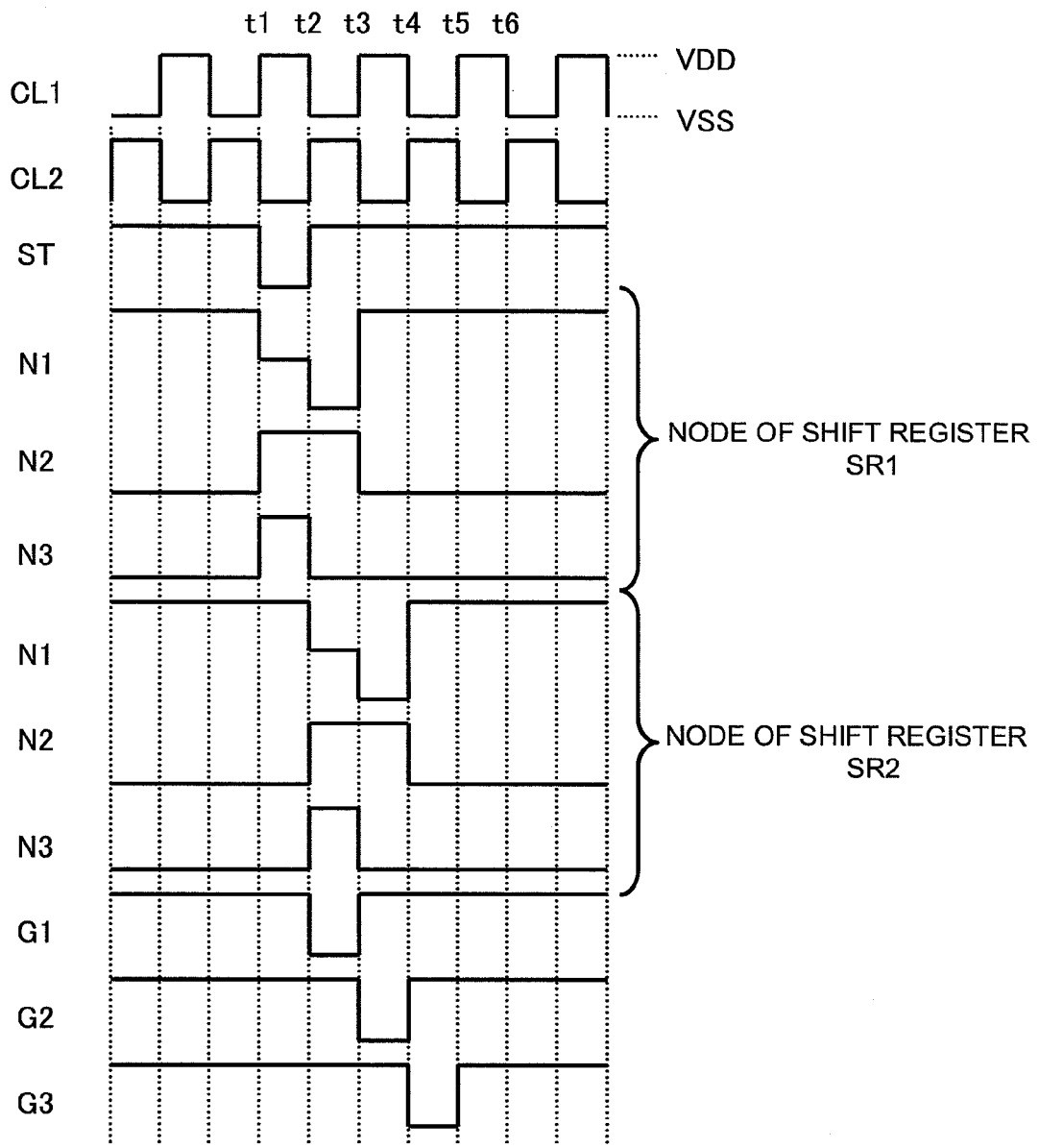
FIG. 15 is a timing chart for illustrating the operation of a shift register stage according to a fifth exemplary embodiment of the present invention.
Figure 16:
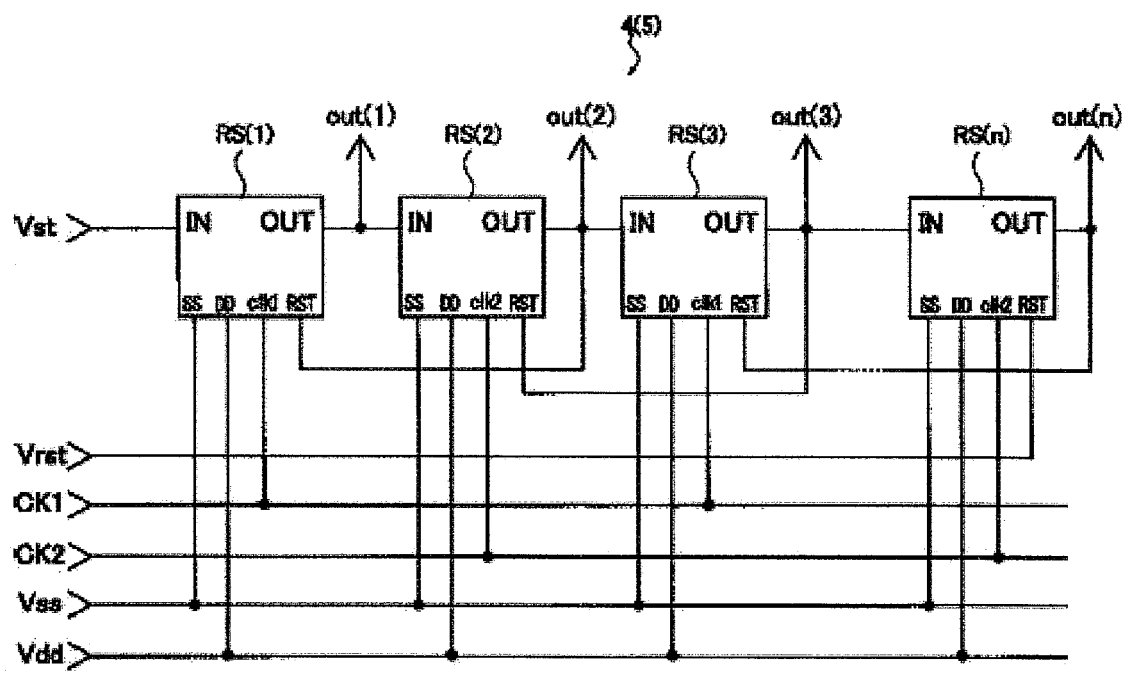
FIG. 16 is a circuit diagram for illustrating the configuration of respective shift register stages of Patent Document 1.
Figure 17:
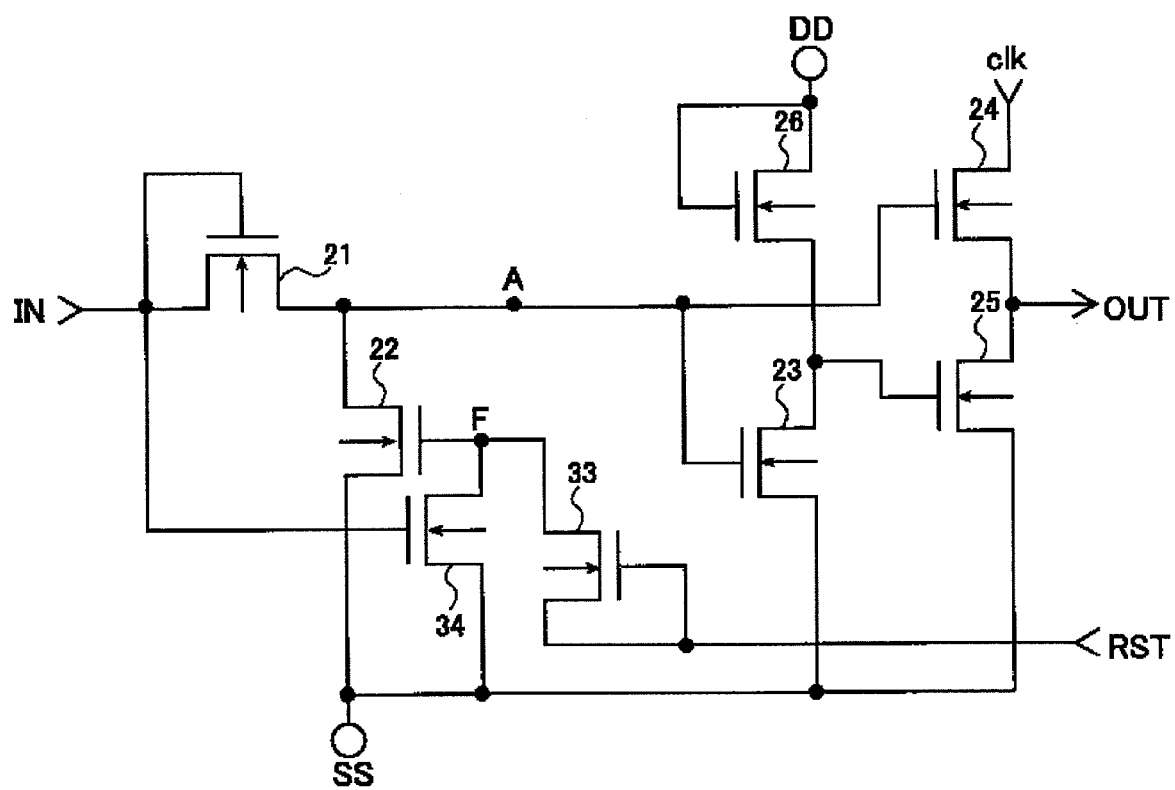
FIG. 17 is a circuit diagram for illustrating each shift register stage of FIG. 16.
Figure 18:
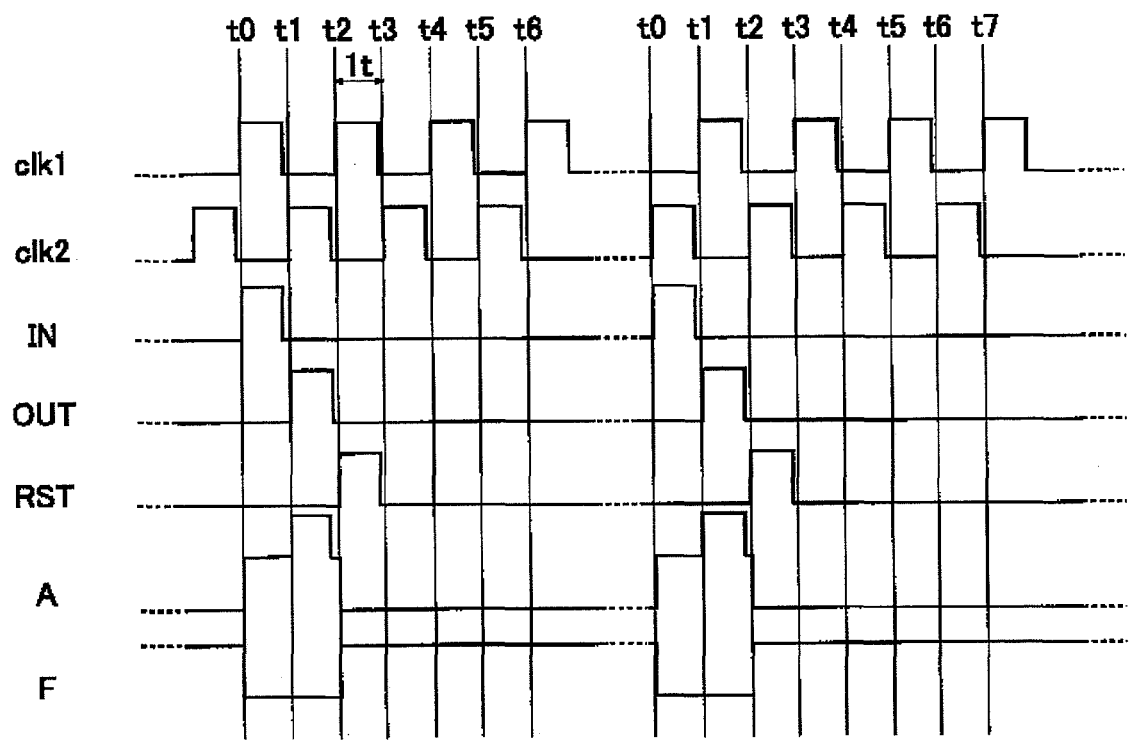
FIG. 18 is a timing chart for illustrating the operation of FIG. 17.

The operation of the shift register stage of the fifth exemplary embodiment of the present invention will now be described. FIG. 15 depicts a timing chart for illustrating the shift register stage of the fifth exemplary embodiment explained with reference to FIGS. 13 and 14. FIG. 15 shows voltage waveforms of first and second clock signals CL1, CL2, the vertical start pulse signal ST, nodes N1 to N3 of the shift register stage SR1 of FIG. 13, nodes N1 to N3 of the shift register stage SR2 of FIG. 13 and outputs G1 to G3 of the shift register stages SR1 to SR3 of FIG. 13.

Referring to FIG. 15, the operation of the shift register stage SR1 will now be described. At time t1, the vertical start pulse signal ST falls to LOW level to render the transistor Tr2 conductive. Since the clock signal CL2 is also LOW, the transistor Tr10 also is conductive, and hence the voltage at the node N1 shifts to a level higher by a threshold value than the LOW level of the clock signal CL2.

The transistor Tr6 is also rendered conductive, and hence the node N2 changes to a HIGH level.

With the node N2 at HIGH level, the transistors Tr5 and Tr7 are rendered non-conductive. The transistor Tr8 becomes conductive, with the node N3 being at a voltage close to the HIGH level to render the transistor Tr4 non-conductive. With the transistor Tr4 non-conductive, the LOW level of the clock signal CL2 is not transmitted via the transistor Tr3 to the node N2.

Since the voltage of the node N1 is low, the transistor Tr1 is conductive. However, since the clock signal CL1 is HIGH, the output signal OUT (G1) stays HIGH.

From time t2 on, the operation is similar to that described above with reference to the first exemplary embodiment, and hence the description is dispensed with.

The operation of the shift register stage SR2 will now be described. The internal circuit of the shift register stage SR2 is of the configuration shown in FIG. 14 in which the clock signal CL2 supplied to the transistors Tr10 and Tr3 is changed to the clock signal CL1 and in which the clock signal CL1 supplied to the transistor Tr1 is changed to the clock signal CL2.

When the input signal IN2 (node N1 of the preceding stage) is at a low voltage (a voltage higher than the LOW voltage by a threshold value Vt) at time t1, the transistor tr2 is rendered conductive. However, since the clock signal CL1 is HIGH, the transistor Tr10 is non-conductive, and hence the voltage at the node N1 remains unchanged at the HIGH level.

Then, at time t2, the input signal IN2 (node N1 of the preceding stage) is at a voltage lower than the LOW level by the bootstrap effect. The transistor Tr2 that receives the input signal IN2 at its gate is kept in its conducting state. Since the clock signal CL1 is at a LOW level voltage, the transistor Tr10 becomes conductive, and hence the node N1 is at a voltage which is higher by the threshold voltage than the LOW level of the clock signal CL1.

Since the input signal IN1 (OUT (G1)) of the preceding stage) is LOW, the transistor Tr6 is also rendered conductive, so that the node N2 transitions to the HIGH level. With the node N2 thus HIGH, the transistors Tr5 and Tr7 are rendered non-conductive. The transistor Tr8 is rendered conductive to raise the voltage of the node N3 to close to the HIGH level to render the transistor Tr4 non-conductive. With the transistor Tr4 non-conductive, the LOW level of the clock signal CL1 is not supplied to the node N2 via the transistor Tr3.

Since the node N1 is at a LOW voltage, the transistor Tr1 is rendered conductive. However, since the clock signal CL2 is HIGH, the output signal OUT (G2) stays HIGH in level.

At time t3, the clock signal CL1 changes to a HIGH level, so that the clock signal CL2 shifts to a LOW level. Since there exist capacitances between the gate and drain electrodes and between the gate and source electrodes of the transistor Tr1, the voltage of the node N1 is pulled down to a value further lower than VSS+Vt, by the bootstrap effect by the respective capacitances, and falls to a value lower than the LOW level.

As a result, a voltage not less than the threshold value is applied across the gate and the source of the transistor Tr1. Hence, the transistor Tr1 is kept in its conducting state, so that the LOW level of the clock signal CL2 is supplied to the output signal OUT (G2). Since the input signal IN1 (OUT (G1) of the preceding stage) has been changed to the HIGH level, the transistor Tr8 is rendered non-conductive. Hence, the node N3 shifts to a voltage higher than the LOW level by a threshold value, by the transistor Tr9, so that the transistor Tr4 is rendered conductive.

Although the transistor Tr4 thus has been rendered conductive, the transistor Tr3 is non-conductive, because the clock signal CL1 is HIGH. The transistor Tr3 shifts to a non-conducting state, and hence the HIGH level of the clock signal CL1 is not supplied to the node N2.

At time t4, the clock signal CL1 shifts to a LOW level, while the clock signal CL2 changes to a HIGH level. The transistor Tr3 then changes to the conducting state. Since the transistor Tr4 also is in the conducting state, the node N2, which has been HIGH in level, changes to a voltage higher than the LOW level by two threshold values (VSS+2Vt). As a result, the transistors Tr5 and Tr7 changes to the conducting state. The condition under which the transistors Tr5 and Tr7 change to the conducting states is $(VDD-Vt) \geq (VSS+2Vt)$.

Since the transistor Tr5 is in the conducting state, the voltage at the node N1, which has been lower than the LOW level by the bootstrap effect, changes to the HIGH level.

With the transistor Tr7 in conducting state, the output signal OUT (G2) transitions to the HIGH level. With the node N1 at HIGH level, the transistor Tr1 shifts to the non-conducting state.

From time t4 on, the LOW level of the clock signal CL1 is delivered at a constant period to the transistor Tr3. Moreover, since the transistor Tr4 is in its conducting state, the low voltage (VSS+2Vt) continues to be supplied to the node N2 at the clock period.

As a result, the transistors Tr5 and Tr7 are kept in conducting states. Hence, the output signal OUT (G1) and the node N1 are kept at HIGH level. This condition remains unchanged until the LOW level of the next input signal IN1 (OUT (G1) of the preceding stage) is supplied.

The operation of the shift register stages SR1, SR2 is as described above. In all of the ensuing shift register stages SR3, SR4, SR5 and so forth, downstream of the shift register stage SR2, the operation is the same as that of the shift register stage SR2, except that the input signals are changed. As a result, the vertical start pulse signal ST is output, as it is sequentially phase-shifted, in order to drive the gate lines G1, G2, G3 and so forth.

In the fifth exemplary embodiment, shown in FIG. 14, the transistor Tr2 is controlled by the node N1 of the preceding stage, and hence may be made conductive at a voltage further lower than the LOW level.

Moreover, the transistor Tr10 has its voltage level controlled by a stabilized clock signal, with the meritorious result that the transistor is less susceptible to variations in TFT characteristics.

The fifth exemplary embodiment has so far been described as a modification of the first exemplary embodiment. However, the fifth exemplary embodiment may be combined with the second to fourth exemplary embodiments.

If, in the fifth exemplary embodiment, the three-phase clock signal, used in the fourth exemplary embodiment, is used, it is sufficient that the clock signal supplied to the transistor Tr10 has a phase lead by one phase with respect to the clock signal supplied to the transistor Tr1. The same applies for the multi-phase clock signal with four or more phases.

The present invention is not limited to the above Examples, and may accommodate certain modifications. For example, the input signals to the respective transistors may be modified, or transistors may newly be added to implement the similar operations.

For example, referring to FIG. 1, a further transistor may be connected between a connection node of the transistors Tr5 and Tr2 and the gate electrode of the transistor Tr1 to prevent the situation in which the voltage of the gate electrode of the transistor Tr1, which may be widely varied by the bootstrap effect, is transferred to the transistors Tr5 and Tr2. In this case, if the further transistor is the p-channel transistor, its gate electrode may be connected to VSS and, if the further transistor is the n-channel transistor, its gate electrode may be connected to VDD. The source electrode or drain electrode of the further transistor may then have one end connected to a connection node of the transistors Tr5 and Tr2, with the other end then being connected to the gate electrode of the transistor Tr1.

In FIG. 5 and FIG. 7, for example, the inverter circuit 100 of FIG. 1 is composed by the transistors Tr8 and Tr9. This is not restrictive and an inverter circuit of any other suitable configuration may also be used. Although the input signal IN or the signal IN1 (OUT of the preceding stage) is used as an input to the inverter circuit, this again is not restrictive. For example, the node N1 of the preceding stage (input signal IN2) may be coupled to the inverter circuit as an input. The same may be said of the transistor Tr6. The input signal to the gate of the transistor Tr6 is not restricted to the input signal IN or IN1 and may, for example, be a node N1 of the preceding stage (input signal IN2) or the own node N1.

Exemplary Embodiment 6

Figure 19:
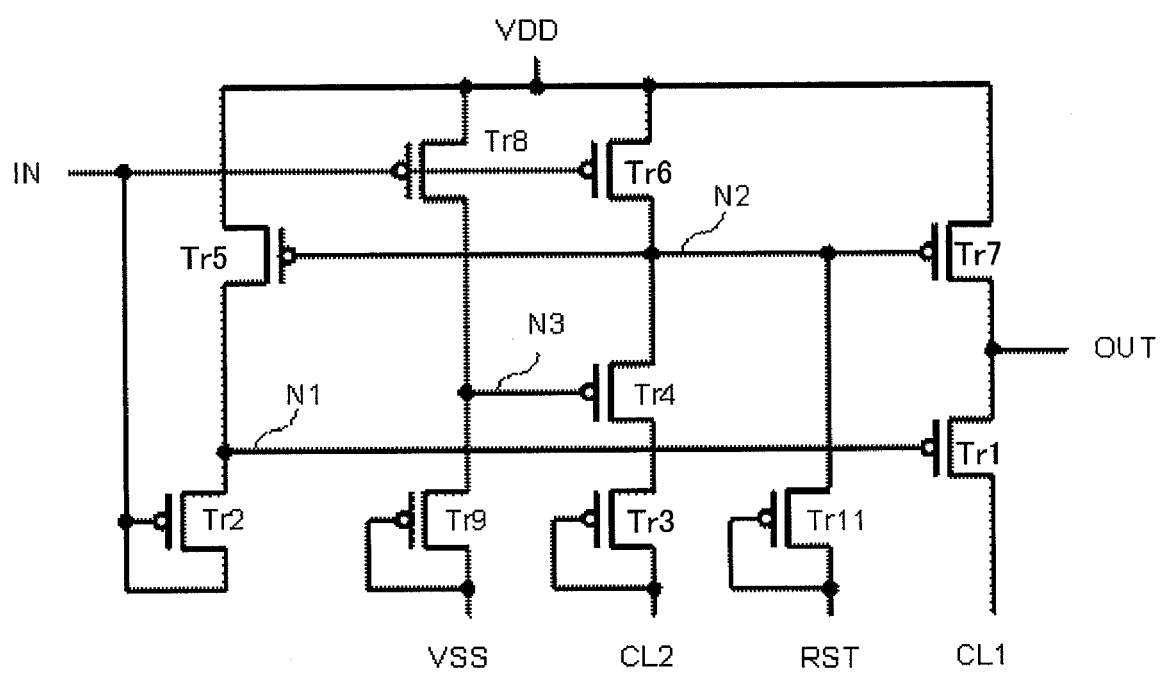
FIG. 19 is a circuit diagram of a bootstrap circuit constituting the shift register stage according to the sixth exemplary embodiment of the present invention.
Figure 20:
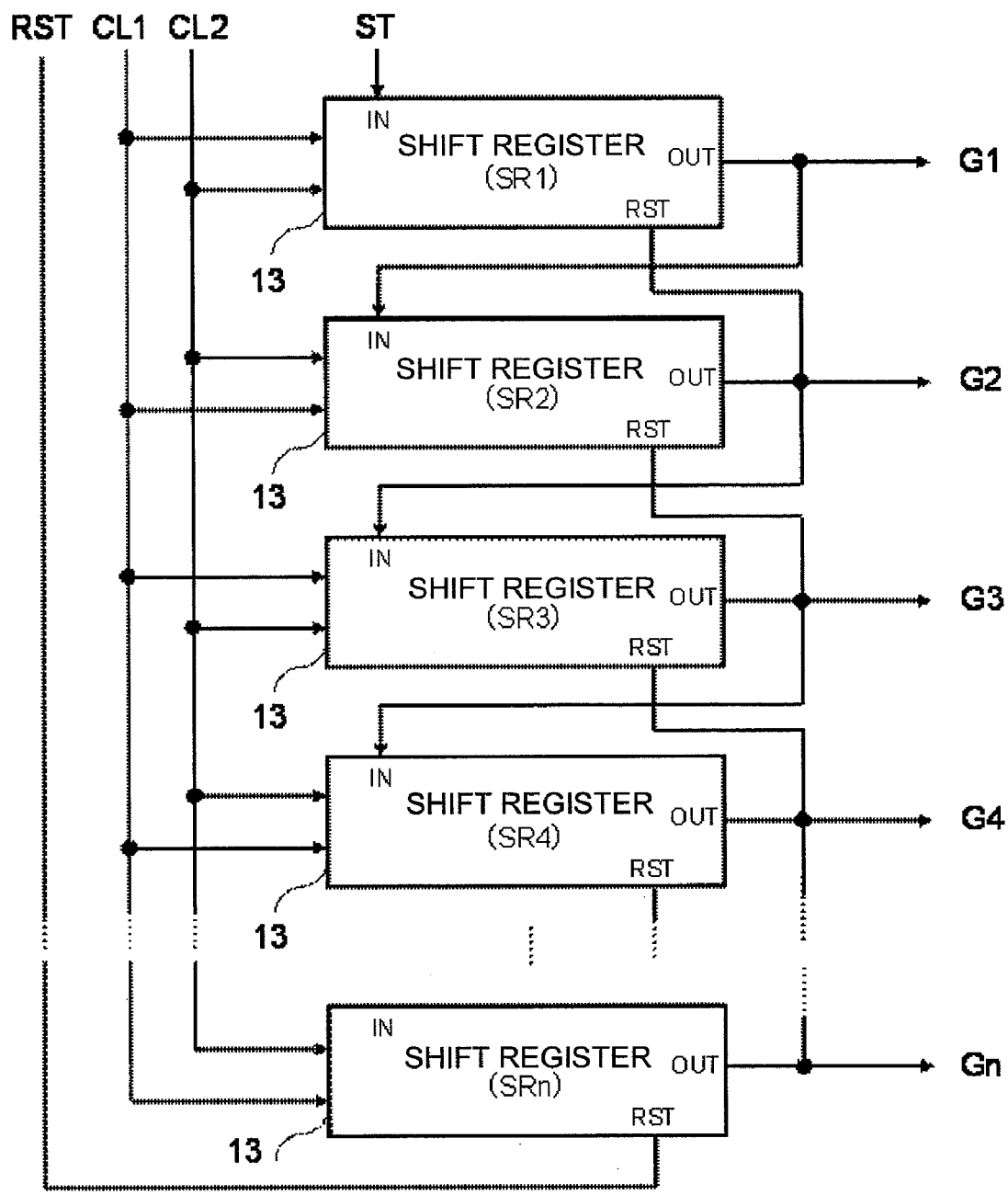
FIG. 20 is a block diagram showing a shift register stage according to a sixth exemplary embodiment of the present invention.
Figure 21:
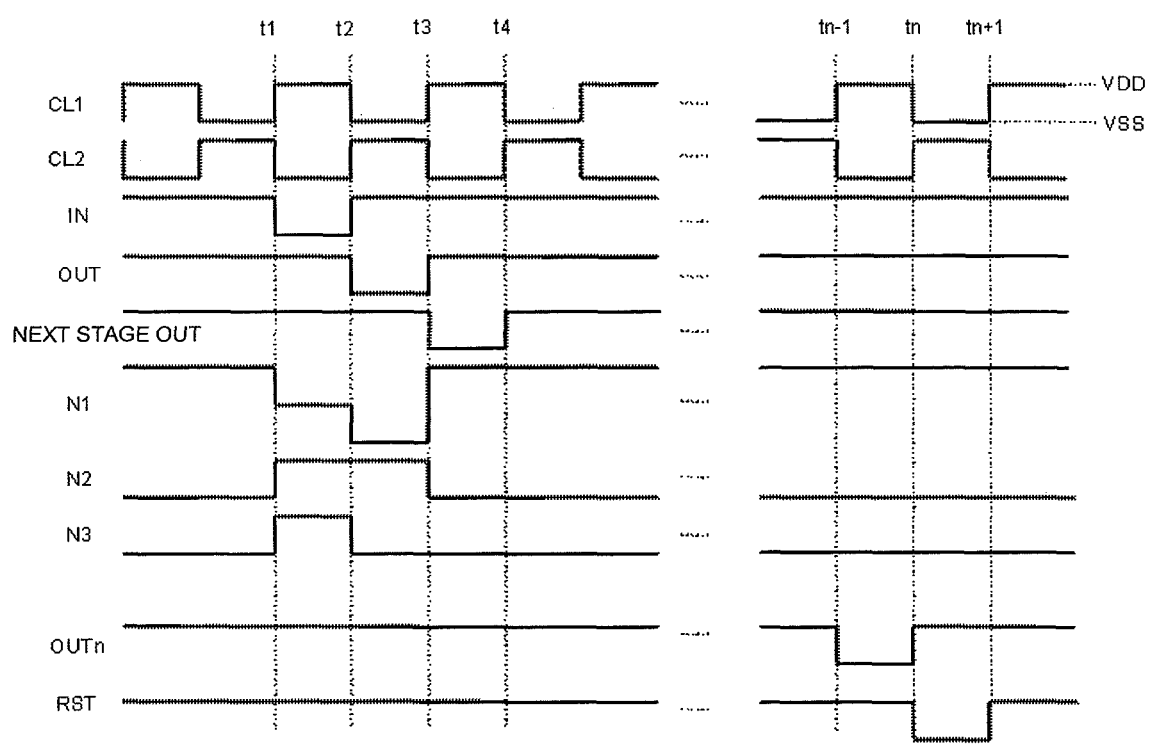
FIG. 21 is a timing chart for illustrating the operation of a shift register stage of FIG. 20.

A sixth exemplary embodiment of the present invention will now be described. In the sixth exemplary embodiment of the present invention, a shift register and a bootstrap circuit composing the shift register are different from the first exemplary embodiment. FIG. 19 is a diagram showing the configuration of the bootstrap circuit of the sixth exemplary embodiment. FIG. 20 is a diagram showing the configuration of the shift register composed by the bootstrap circuit shown in FIG. 19.

As shown in FIG. 19, this bootstrap circuit is composed by p-channel transistors Tr1 to Tr9 and Tr11. The transistor Tr1 is connected between a clock signal terminal CL1 and an output terminal. The transistor Tr2 is diode-connected and has a gate electrode connected to an input terminal IN and a source connected to a gate electrode of the transistor Tr1. The transistor Tr3 has a gate electrode connected to a clock signal terminal CL2. The transistor Tr4 is cascode connected to the transistor Tr3 and has a gate electrode connected to an output of an inverter circuit 100 which has an input connected to the input terminal IN. The transistor Tr5 is connected between a gate electrode of the transistor Tr1 and a power supply terminal VDD. The transistor Tr6 is connected between the transistor Tr4 and the power supply terminal VDD and has a gate electrode connected to the input terminal IN. The transistor Tr7 is connected between the power supply terminal VDD and the output terminal and has a gate electrode connected to the connection node of transistors Tr6 and Tr4 and also connected to a gate electrode of the transistor Tr5. The transistor Tr8 is connected between a gate electrode of the transistor Tr4 and the power supply terminal VDD and has a gate electrode connected to the input terminal IN. The transistor Tr9 is connected between the gate electrode of the transistor Tr4 and a power supply terminal VSS and is diode-connected.

As shown in FIG. 20, clock signals (CL1, CL2) are supplied to a shift register SR1 and a start pulse signal. An output signal OUT of a succeeding stage shift register SR2 are supplied respectively to terminals IN and RST of the shift register SR1. Each of shift registers from the shift register SR2 receives clock signals (CL1, CL2) and receives, respectively, at terminals IN and RST thereof, output signals OUT of the preceding and succeeding stage shift registers. The last stage shift register SRn receives clock signals (CL1, CL2) and receives, respectively, at terminals IN and RST thereof, output signals OUT of the preceding stage shift register SRn-1 and a reset pulse signal RST.

The bootstrap circuit shown in FIG. 19 differs from that of FIG. 5 in that the p-channel transistor Tr11 is added. The transistor Tr11 has a gate electrode and a drain terminal commonly connected to the terminal RST and has a source terminal connected to the node N2. When the terminal RST is LOW, the transistor Tr1 is turned on to set the node to a LOW level. The transistors T5 and Tr7 are turned on. As a result, the node N1 is set to the power supply voltage VDD and the transistor Tr1 is turned off. With the transistor Tr7 being conductive, the output OUT is reset to the HIGH level. The configuration other than the transistor Tr11 is the same as that of the first and second exemplary embodiments, and hence the description is dispensed with.

In FIG. 19, the similar circuit configuration may be constructed by using n-channel transistor, in place of p-channel transistors, with the different polarity of the output.

The operation of the shift register stage of the sixth exemplary embodiment of the present invention will now be described with reference to FIG. 20. FIG. 20 is a timing chart for illustrating the bootstrap circuit of FIG. 19. The operation of from time t1 to time t3, is the same as that of the first and second exemplary embodiment and hence the description is dispensed with.

At time t3, the node N3 and the cock signal CL2 changes to a LOW level. Thus transistors Tr4 and TR3 are both turned on to make the node N2 change from a HIGH level to a LOW level. The output of the succeeding stage shift register, to which the terminal RST is connected, becomes LOW and hence the transistor Tr11 is turned on to set the node N2 from a HIGH level to a LOW level.

The present exemplary embodiment differs from the above described exemplary embodiment in that the node N2 is changed to a LOW level through two paths.

The present exemplary embodiment also differs from the above described exemplary embodiment in that the output OUT of the last stage shift register SRn, after transitioning to a LOW level at time tn-1, transitions to a HIGH level at time tn and at the same time the HIGH level reset pulse signal RST is supplied to the terminal RST of the last stage shift register SRn.

In the present exemplary embodiment, since it is possible to make the node N2 reset to the LOW level by utilizing the transistor Tr11, the node N2 is changed to the LOW level in more reliable manner.

As a modification of the present exemplary embodiment, the vertical start pulse signal ST may be input to the terminal RST of the shift register SRn.

Exemplary Embodiment 7

Figure 22:
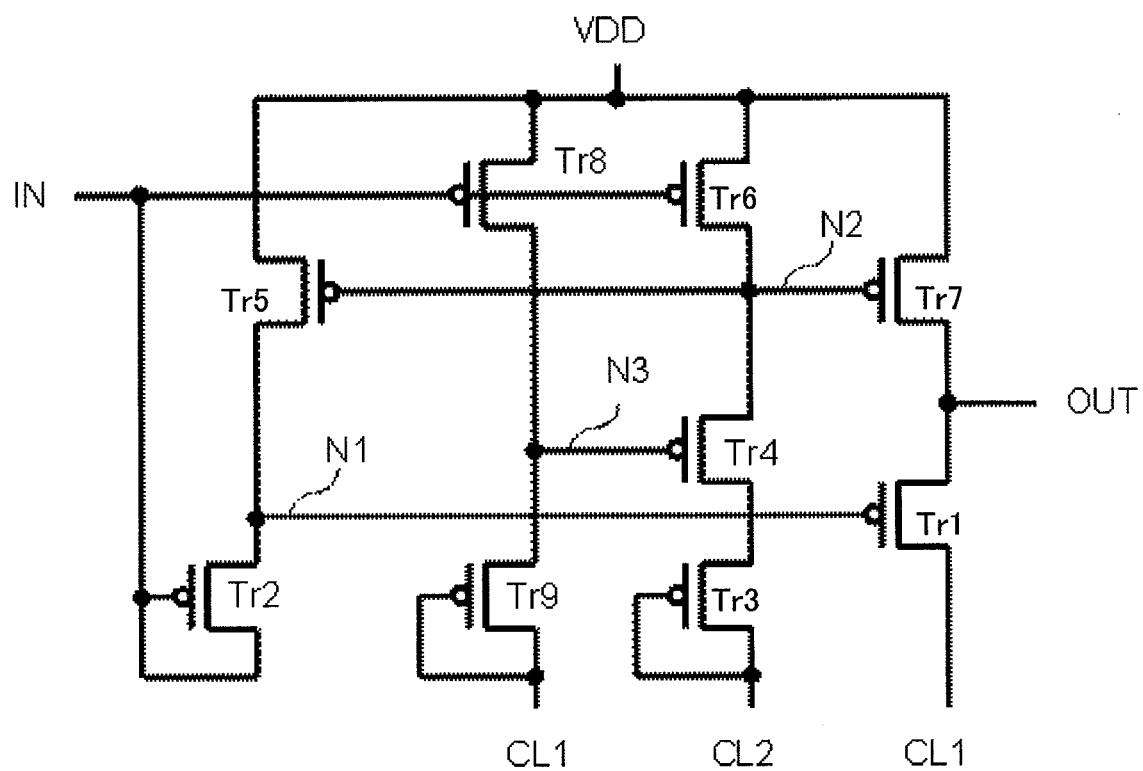
FIG. 22 is a circuit diagram of a bootstrap circuit constituting the shift register stage according to the seventh exemplary embodiment of the present invention.

A seventh exemplary embodiment of the present invention will now be described. In the seventh exemplary embodiment of the present invention, a shift register is different from the first exemplary embodiment. FIG. 22 is a diagram showing the configuration of the bootstrap circuit of the seventh exemplary embodiment. As shown in FIG. 22, this bootstrap circuit is composed by p-channel transistors Tr1 to Tr9.

The transistor Tr1 is connected between a clock signal terminal CL1 and an output terminal OUT. The transistor Tr2 is diode-connected and has a gate electrode connected to an input terminal IN and a source connected to a gate electrode of the transistor Tr1. The transistor Tr3 is diode-connected and has a gate electrode connected to a clock signal terminal CL2. The transistor Tr4 is cascode connected to the transistor Tr3. The transistor Tr5 is connected between a gate electrode of the transistor Tr1 and a power supply terminal VDD. The transistor Tr6 is connected between the transistor Tr4 and the power supply terminal VDD and has a gate electrode connected to the input terminal IN. The transistor Tr7 is connected between the power supply terminal VDD and the output terminal and has a gate electrode connected to the connection node of transistors Tr6 and Tr4 and also connected to a gate electrode of the transistor Tr5. The transistor Tr8 is connected between a gate electrode of the transistor Tr4 and the power supply terminal VDD and has a gate electrode connected to the input terminal IN. The transistor Tr9 is connected between the electrode of the transistor Tr4 and the clock signal terminal CL1. The transistor Tr9 is diode-connected.

In the configuration of FIG. 5, the diode-connected Tr9 is connected between the node N3 and the power supply terminal VSS. In the present embodiment, as shown in FIG. 22, the diode-connected Tr9 is connected between the node N3 and the clock signal terminal CL1. That is, the p-channel transistor Tr9 has a source terminal connected to the node N3 and a gate electrode and a drain terminal connected to the clock signal terminal CL1. The configuration other than the connection of the transistor Tr9 is the same as that of FIG. 5.

In FIG. 22, the similar circuit configuration may be constructed by using n-channel transistor, in place of p-channel transistors, with the different polarity of the output.

Figure 23:
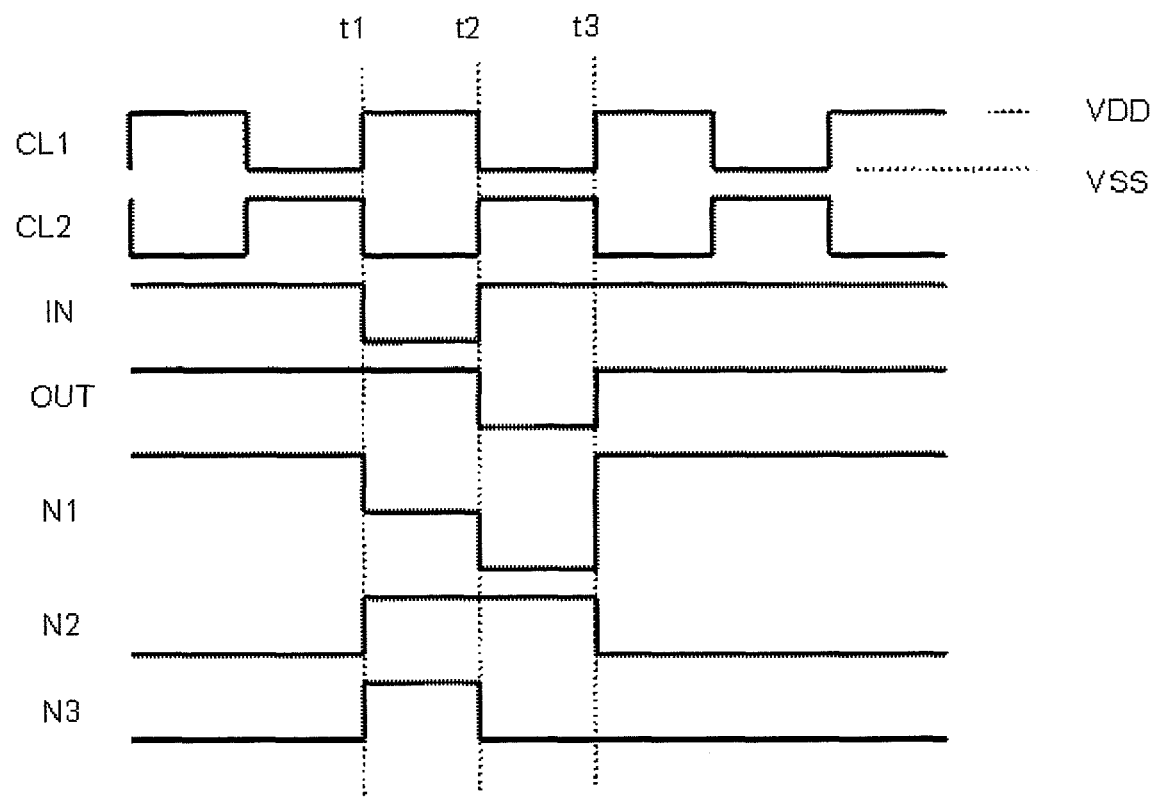
FIG. 23 is a timing chart for illustrating the operation of a shift register stage of FIG. 22.

The operation of the circuit of FIG. 22 will be described with reference to FIG. 23. FIG. 23 is a timing chart for illustration the operation of the circuit of FIG. 22. The operation other than the transistor Tr9 is the same as that of the first exemplary embodiment and hence the description is dispensed with. The operation of the transistor Tr9 will be described in the below.

At time t1, the clock signal CL1 is HIGH to set the transistor to a non-conductive state. At time 2, the clock signal CL1 transitions to LOW to set the transistor Tr9 to a conductive state. The node N3 is at a voltage higher by a threshold value than the LOW level (VSS+Vt).

In the bootstrap circuit according to the first to sixth exemplary embodiments, for example, in the bootstrap circuit shown in FIG. 5, at a time interval from time t1 to t2, the transistors Tr8 and Tr9 are both on and hence a current flows from the high potential power supply terminal VDD to the low potential power supply terminal VSS via the transistors Tr8 and Tr9.

Contrary to this, in the bootstrap circuit according to the present exemplary embodiment, at a time interval from time t1 to t2, the transistor Tr9 is non conductive and no current flows from the high potential power supply terminal VDD to the low potential power supply terminal VSS via the transistor Tr9. Therefore, according to the present exemplary embodiment, the bootstrap circuit of low power dissipation is realized.

Exemplary Embodiment 8

Figure 24:
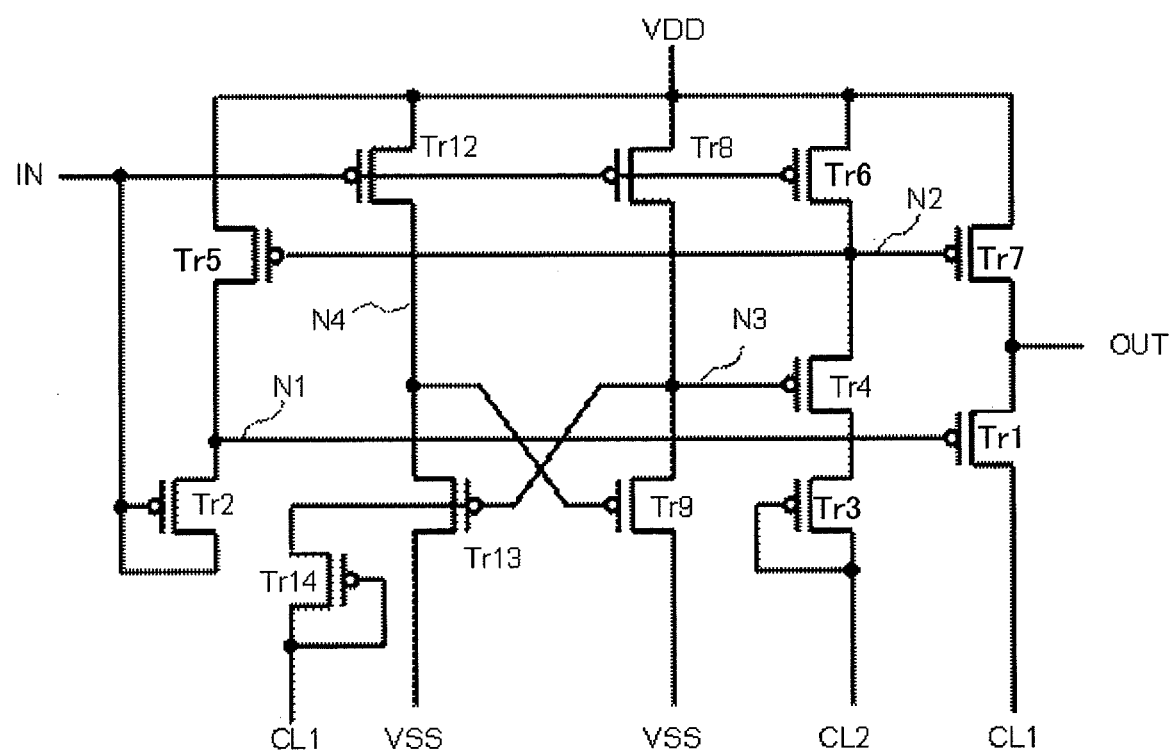
FIG. 24 is a circuit diagram of a bootstrap circuit constituting the shift register stage according to the eighth exemplary embodiment of the present invention.

An eighth exemplary embodiment of the present invention will now be described. In the eighth exemplary embodiment of the present invention, a shift register is different from the first exemplary embodiment. FIG. 24 is a diagram showing the configuration of the bootstrap circuit of the eighth exemplary embodiment. As shown in FIG. 24, this bootstrap circuit is composed by p-channel transistors Tr1 to Tr14.

The transistor Tr1 is connected between a clock signal terminal CL1 and an output terminal OUT. The transistor Tr2 is diode-connected and has a gate electrode connected to an input terminal IN and a source connected to a gate electrode of the transistor Tr1. The transistor Tr3 is diode-connected and has a gate electrode connected to a clock signal terminal CL2. The transistor Tr4 is cascode connected to the transistor Tr3. The transistor Tr5 is connected between a gate electrode of the transistor Tr1 and a power supply terminal VDD. The transistor Tr6 is connected between the transistor Tr4 and the power supply terminal VDD and has a gate electrode connected to the input terminal IN. The transistor Tr7 is connected between the power supply terminal VDD and the output terminal and has a gate electrode connected to the connection node of transistors Tr6 and Tr4 and also connected to a gate electrode of the transistor Tr5. The transistor Tr8 is connected between a gate electrode of the transistor Tr4 and the power supply terminal VDD and has a gate electrode connected to the input terminal IN. The transistor Tr9 is connected between the electrode of the transistor Tr4 and the power supply terminal VSS. The transistors Tr13 and Tr12 are cascode connected between the power supply terminals VDD and VSS. The transistors Tr14 is connected between a gate electrode of the transistor Tr13 and the clock signal terminal CL1. A gate electrode of the transistor Tr9 is connected to a connection node of the transistors Tr12 and Tr13. A gate electrode of the transistor Tr13 is connected to the gate electrode of the transistor Tr4. A gate electrode of the transistor Tr12 is connected to the input terminal IN.

Referring to FIG. 24, the bootstrap circuit according to the present exemplary embodiment differs from the circuit configuration of FIG. 5 in that the p-channel transistors Tr12, Tr13, and Tr14 are added. Further, the connection of the transistor Tr9 is different from that of FIG. 5.

The transistors Tr12 and Tr13 are arranged between the power supply terminals VDD-VSS and have respective gate electrode connected to the terminal IN and the node N3. The transistors Tr14 is diode-connected and has a drain terminal connected to the clock signal terminal CL1 and a source terminal connected to the gate electrode of transistors Tr13. A gate electrode of the transistor Tr9 is connected to a connection node (node N4) of the transistors Tr12 and Tr13.

In FIG. 24, the similar circuit configuration may be constructed by using n-channel transistor, in place of p-channel transistors, with the different polarity of the output.

Figure 25:
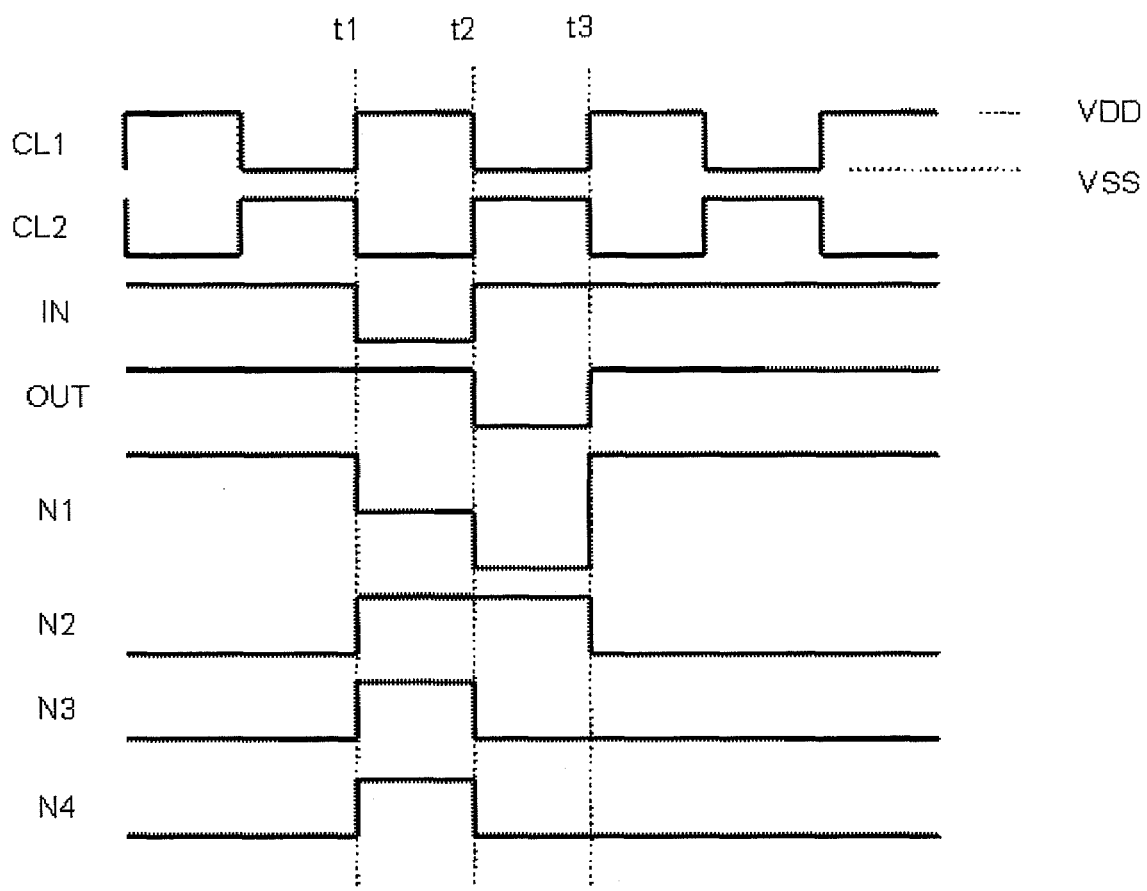
FIG. 25 is a timing chart for illustrating the operation of a shift register stage of FIG. 24.

The operation of the circuit of FIG. 24 will be described with reference to FIG. 25. FIG. 25 is a timing chart for illustration the operation of the circuit of FIG. 24. The operation other than the transistor Tr9 and transistors Tr12 to Tr14 is the same as that of the first exemplary embodiment and hence the description is dispensed with. The operation of each of the transistor Tr9 and transistors Tr12 to Tr14 will be described in the below.

At time t1, when the terminal In is LOW, the transistor TR12 is rendered conductive and hence the node N4 which is connected to a drain of the transistor Tr12 transitions to a HIGH level. At this time, since the clock signal CL1 is HIGH, the transistor Tr14 is non-conductive. The transistor Tr13 is non-conductive because the node N3 is as a HIGH level. The transistor Tr9 is non-conductive because the node N4 is as a HIGH level.

With this operation, since when the transistor Tr8 is conductive, the transistor Tr9 is non-conductive, there is no current flowing between the high potential power supply terminal VDD and the low potential power supply terminal VSS.

At time t2, the clock signal CL1 transitions from a HIGH level to a LOW level and the transistor Tr14 is rendered conductive. The node N3 is at a voltage higher by a threshold value of the transistor Tr14 than the LOW level (VSS+Vt). Thus, the transistor Tr13 is rendered conductive and hence the node N4 is at a voltage higher by a threshold value of the transistor Tr13 than the LOW level (VSS+Vt). As a result, the transistor Tr9 is rendered conductive.

In the bootstrap circuit shown in FIG. 5, for example, at a time interval from time t1 to t2, the transistors Tr8 and Tr9 are both on and hence a current flows from the high potential power supply terminal VDD to the low potential power supply terminal VSS via the transistors Tr8 and Tr9.

Contrary to this, in the bootstrap circuit according to the present exemplary embodiment, there is no time interval at which transistors between the high potential power supply terminal VDD to the low potential power supply terminal VSS are all turned on at the same time and no current flows from the high potential power supply terminal VDD to the low potential power supply terminal VSS via the transistor Tr9. Therefore, according to the present exemplary embodiment, the bootstrap circuit of low power dissipation is realized.

In the above Examples, the shift register is used as the gate line driving circuit. It is however naturally possible to use the shift register as the source line driving circuit. The present invention may further be applied not only to a display but also to electronic apparatus making use of the shift register.

The disclosures of the aforementioned Patent Documents are incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A bootstrap circuit which receives an input signal and a plurality of clock signals and generates an output signal, comprising:
   a first transistor that receives a first clock signal and that, when in a conductive state, outputs the first clock signal as the output signal;
   a first control unit that is connected to a control terminal of the first transistor and that renders the first transistor conductive, in response to the input signal;
   a second control unit that is connected to the control terminal of the first transistor and that renders the first transistor non-conductive in response to an input signal and to a second clock signal, the second clock signal having a phase lead by a half cycle or by one phase with respect to the first clock signal, with the plurality of clock signals constituting N-phase clocks, where N is an integer greater than or equal to two; and
   a third control unit that is connected to the control terminal of the first transistor and that renders the first transistor non-conductive, in response to a control signal, the control signal being different from the input signal.

2. The bootstrap circuit according to claim 1, wherein the first control unit includes a second transistor having conducting and non-conducting states thereof controlled by the input signal.

3. The bootstrap circuit according to claim 1, wherein the input signal used in the second control unit is the same signal as the input signal used in the first control unit or a different signal.

4. The bootstrap circuit according to claim 1, wherein the third control unit comprises an eleventh transistor having conducting and non-conducting state thereof controlled by the control signal.

5. A shift register including the bootstrap circuit as set forth in claim 1.

6. A circuit comprising a plurality of stages of shift registers connected in cascade, each of the shift registers as set forth in claim 5, wherein the plurality of clock signals includes two-phase clock signals, and
   wherein, in an odd stage shift register, the first transistor receives the first clock signal and the second control unit receives the second clock signal, and
   in an even stage shift register, the first and second clock signals are interchanged as they are input, the first transistor receives the second clock signal interchanged, as the first clock signal, and the second control unit receives the first clock signal interchanged, as the second clock signal.

7. A circuit comprising a plurality of stages of shift registers connected in cascade, each of the shift registers as set forth in claim 5, wherein the plurality of clock signals includes three-phase clock signals, and
   wherein in a shift register stage in which the remainder obtained on dividing the stage number by three is 1, a first phase clock and a third phase clock are respectively received as the first and second clock signals,
   in a shift register stage in which the remainder obtained on dividing the stage number by three is 2, the first phase clock and a second phase clock are respectively received as the first and second clock signals, and
   in a shift register stage in which the remainder obtained on dividing the stage number by three is 0, the third phase clock and the second phase clock are respectively received as the first and second clock signals.

8. A display device having a driving circuit formed by the shift register as set forth in claim 5.

9. A bootstrap circuit which receives an input signal and a plurality of clock signals and generates an output signal, comprising:
   a first transistor that receives a first clock signal and that, when in a conductive state, outputs the first clock signal as the output signal;
   a first control unit that is connected to a control terminal of the first transistor and that renders the first transistor conductive, in response to the input signal; and
   a second control unit that is connected to the control terminal of the first transistor and that renders the first transistor non-conductive in response to an input signal and to a second clock signal, the second clock signal having a phase lead by a half cycle or by one phase with respect to the first clock signal, with the plurality of clock signals constituting N-phase clocks, where N is an integer greater than or equal to two,
   wherein the second control unit comprises:
   a third transistor that has conducting and non-conducting states thereof controlled by the second clock signal;
   a fourth transistor that is connected in series with the third transistor;
   an inverter circuit that controls conducting and non-conducting states of the fourth transistor;
   a fifth transistor that supplies to a control terminal of the first transistor a potential that renders the first transistor non-conductive; and
   a sixth transistor that is connected between a control terminal of the fifth transistor and a power supply terminal and that renders the fifth transistor non-conductive.

10. The bootstrap circuit according to claim 9, wherein the sixth transistor has a control terminal supplied with the input signal.

11. The bootstrap circuit according to claim 9, wherein the inverter circuit receives the input signal and that has an output connected to a control terminal of the fourth transistor.

12. The bootstrap circuit according to claim 9, further comprising a seventh transistor that, when the third and fourth transistors are both conductive, is rendered conductive, in accordance with the value of the second clock signal to output the output signal having a preset voltage.

13. The bootstrap circuit according to claim 9, wherein the inverter circuit includes:
   a eighth transistor that has conducting and non-conducting states thereof controlled by the input signal; and
   a ninth transistor that is diode-connected and connected in series with the eighth transistor.

14. The bootstrap circuit according to claim 9, wherein the inverter circuit is configured to cut off a current path thereof between a high potential power supply and a low potential power supply.

15. The bootstrap circuit according to claim 9, wherein the inverter circuit includes:
   a eighth transistor that has conducting and non-conducting states thereof controlled by the input signal; and
   a ninth transistor that is connected in series with the eighth transistor and that has conducting and non-conducting states thereof controlled by the first clock signal.

16. A bootstrap circuit which receives an input signal and a plurality of clock signals and generates an output signal, comprising:
   a first transistor that receives a first clock signal and that, when in a conductive state, outputs the first clock signal as the output signal;
   a first control unit that is connected to a control terminal of the first transistor and that renders the first transistor conductive, in response to the input signal; and a second control unit that is connected to the control terminal of the first transistor and that renders the first transistor non-conductive in response to an input signal and to a second clock signal, the second clock signal having a phase lead by a half cycle or by one phase with respect to the first clock signal, with the plurality of clock signals constituting N-phase clocks, where N is an integer greater than or equal to two, wherein the first control unit includes:

a second transistor having conducting and non-conducting states thereof controlled by the input signal; and a tenth transistor that is connected in series with the second transistor and that the has conducting and non-conducting states thereof controlled by the second clock signal.

17. A bootstrap circuit which receives an input signal and a plurality of clock signals and generates an output signal, comprising:

a first transistor that receives a first clock signal and that, when in a conductive state, outputs the first clock signal as the output signal;

a first control unit that is connected to a control terminal of the first transistor and that renders the first transistor conductive, in response to the input signal; and a second control unit that is connected to the control terminal of the first transistor and that renders the first transistor non-conductive in response to an input signal and to a second clock signal, the second clock signal having a phase lead by a half cycle or by one phase with respect to the first clock signal, with the plurality of clock signals constituting N-phase clocks, where N is an integer greater than or equal to two, wherein the first transistor is connected between a first clock signal terminal at which the first clock signal is received and an output terminal at which the output signal is output, the first control unit includes a second transistor that has a control terminal connected to an input terminal at which the input signal is received and that has one terminal connected to a control terminal of the first transistor; and the second control unit includes:

a third transistor that has a control terminal connected to a second clock signal terminal at which the second clock signal is received;

an inverter circuit that has an input connected to the input terminal;

a fourth transistor that is cascode connected to the third transistor and that has a control terminal connected to an output of the inverter circuit;

a fifth transistor that is connected between the control terminal of the first transistor and a power supply terminal;

a sixth transistor that is connected between the fourth transistor and the power supply terminal and that has a control terminal connected to the input terminal; and a seventh transistor that is connected between the output terminal and the power supply terminal, the fifth and seventh transistors having control terminals connected in common to a connection node of the fourth transistor and the sixth transistor.

18. A bootstrap circuit which receives an input signal and a plurality of clock signals and generates an output signal, comprising:

a first transistor that receives a first clock signal and that, when in a conductive state, outputs the first clock signal as the output signal;

a first control unit that is connected to a control terminal of the first transistor and that renders the first transistor conductive, in response to the input signal; and a second control unit that is connected to the control terminal of the first transistor and that renders the first transistor non-conductive in response to an input signal and to a second clock signal, the second clock signal having a phase lead by a half cycle or by one phase with respect to the first clock signal, with the plurality of clock signals constituting N-phase clocks, where N is an integer greater than or equal to two, wherein the first transistor is connected between a first clock signal terminal at which the first clock signal is received and an output terminal at which the output signal is output, the first control unit includes a second transistor that has a control terminal connected to an input terminal at which the input signal is received and that has one terminal connected to a control terminal of the first transistor, and the second control unit includes:

a third transistor that has a control terminal connected to a second clock signal terminal at which the second clock signal is received;

a fourth transistor that is cascode connected to the third transistor;

a fifth transistor that is connected between the control terminal of the first transistor and a first power supply terminal;

a sixth transistor that is connected between the fourth transistor and the first power supply terminal and that has a control terminal connected to the input terminal;

a seventh transistor that is connected between the first power supply terminal and the output terminal and that has a control terminal connected to the connection node of the sixth transistor and the fourth transistor and also connected to a control terminal of the fifth transistor;

an eighth transistor that is connected between a control terminal of the fourth transistor and the first power supply terminal and that has a control terminal connected to the input terminal;

a ninth transistor that is diode-connected and connected between the control terminal of the fourth transistor and a second power supply terminal; and an eleventh transistor that is diode-connected and connected between the control terminal of the seventh transistor and a reset terminal at which a reset signal is received.

19. A bootstrap circuit which receives an input signal and a plurality of clock signals and generates an output signal, comprising:

a first transistor that receives a first clock signal and that, when in a conductive state, outputs the first clock signal as the output signal;

a first control unit that is connected to a control terminal of the first transistor and that renders the first transistor conductive, in response to the input signal; and a second control unit that is connected to the control terminal of the first transistor and that renders the first transistor non-conductive in response to an input signal and to a second clock signal, the second clock signal having a phase lead by a half cycle or by one phase with respect to the first clock signal, with the plurality of clock signals constituting N-phase clocks, where N is an integer greater than or equal to two, wherein the first transistor is connected between a first clock signal terminal at which the first clock signal is received and an output terminal at which the output signal is output, the first control unit includes a second transistor that has a control terminal connected to an input terminal at which the input signal is received and that has one terminal connected to a control terminal of the first transistor, and the second control unit includes:

a third transistor that has a control terminal connected to a second clock signal terminal at which the second clock signal is received;

an inverter circuit that has an input connected to the input terminal;

a fourth transistor that is cascode connected to the third transistor and that has a control terminal connected to an output of the inverter circuit;

a fifth transistor that is connected between the control terminal of the first transistor and a power supply terminal;

a sixth transistor that is connected between the fourth transistor and the power supply terminal and that has a control terminal connected to the input terminal;

a seventh transistor that is connected between the power supply terminal and the output terminal and that has a control terminal connected to the connection node of the sixth transistor and the fourth transistor and also connected to a control terminal of the fifth transistor;

wherein the inverter circuit comprises:

an eighth transistor that is connected between a control terminal of the fourth transistor and the power supply terminal and that has a control terminal connected to the input terminal; and a ninth transistor that is diode-connected and connected between the control terminal of the fourth transistor and the first clock signal terminal.

* * * * *